(12) United States Patent
Sato et al.

(10) Patent No.: US 7,122,282 B2
(45) Date of Patent: Oct. 17, 2006

(54) MASK PATTERN FORMING METHOD AND PATTERNING METHOD USING THE MASK PATTERN

(75) Inventors: Yoshikazu Sato, Tokyo (JP); Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 289 days.

(21) Appl. No.: 10/391,799

(22) Filed: Mar. 20, 2003

(65) Prior Publication Data
US 2003/0180633 A1 Sep. 25, 2003

(30) Foreign Application Priority Data
Mar. 22, 2002 (JP) .............................. 2002-081180

(51) Int. Cl.
G03F 9/00 (2006.01)
G03C 5/00 (2006.01)
(52) U.S. Cl. ............................ 430/5; 430/312; 430/322
(58) Field of Classification Search .................... 430/5, 430/312, 313, 314, 323, 324, 322
See application file for complete search history.

(56) References Cited

U.S. PATENT DOCUMENTS 5,366,848 A * 11/1994 Thane et al. ................. 430/313
6,303,272 B1 * 10/2001 Furukawa et al. ........... 430/314

FOREIGN PATENT DOCUMENTS

EP 0 341 843 A2 11/1989
JP 10-312063 11/1998

* cited by examiner

Primary Examiner—Christopher G. Young
(74) Attorney, Agent, or Firm—Buchanan Ingersoll & Rooney PC

(57) ABSTRACT

A method of forming a mask pattern includes a step of laminating a first resist layer on a base layer, a step of exposing the first resist layer using a first pattern with a pattern of at least one via hole, a step of developing the first resist layer exposed to remove a part of the first resist layer, the part corresponding to an area of the at least one via hole, a step of laminating a second resist layer on the first resist layer and on the base layer in the area of the at least one via hole, a step of exposing the second resist layer using a second pattern, and a step of developing the second resist layer exposed and the first resist layer to remove a part of the second resist layer and all of the first resist layer so as to form the mask pattern made of the second resist layer.

16 Claims, 14 Drawing Sheets

MASK PATTERN FORMING METHOD AND PATTERNING METHOD USING THE MASK PATTERN

FIELD OF THE INVENTION

The present invention relates to a method of forming a mask pattern and a patterning method using the mask pattern.

DESCRIPTION OF THE RELATED ART

During fabrication of thin-film elements such as thin-film magnetic heads, semiconductor elements or micro-devices, a plurality of patterning processes such as milling or dry-etching processes, lift-off processes or milling and lift-off combination processes are performed. Each of these patterning processes starts from forming of a photoresist pattern for a mask.

Although there are various structures of the photoresist pattern, a two-layered resist pattern with an inversed-trapezoidal cross section or a T-shaped cross section with a pillar portion and a overhang portion has recently received attention.

European patent publication No. 0341843 A2 discloses a two-layered resist pattern with an upper layer of a photoresist material and a lower layer of a polymethylglutarimide (PMGI) polymer. Since the PMGI polymer has a different solubility from that of the upper layer photoresist material with respect to a developing solution, a desired undercut of the two-layered resist pattern is obtained.

However, because a viscosity of the PMGI polymer is inevitably low, it is impossible to form a thick PMGI resist pattern. For example, the maximum thickness of the two-layered resist pattern with the PMGI lower layer may be less than 10 μm. Therefore, a thin-film pattern with a relatively large thickness cannot be formed by the lift-off method using the mask of this two-layered resist pattern with the PMGI lower layer.

Also, since the patterning of the lower PMGI layer is controlled by utilizing the solubility of the PMGI polymer with respect to the developing solution for the upper layer resist material, it is very difficult to precisely control the cross-section shape of the two-layered resist pattern that has a large step, an upper layer that has a width less than three times of the lower layer thickness or an undercut that has a length more than the lower layer thickness.

Further, in case that the lower layer is made of a novolak resin material or naphthoquinonediazido (NQD) novolak resist material, intermixing at the interface between the lower layer and the upper layer may occur when the upper layer is coated. Thus, in this case, it is impossible to obtain a resist pattern with a desired shape. If the lower layer is heat-treated until no intermixing will occur, the photosensitivity of the lower layer is lost and the two-layered resist pattern with a T-shaped cross section cannot be formed.

In order to solve the aforementioned problems in the prior art, the applicants of this application have proposed, in Japanese patent application No. 2001-327745 published May 9, 2003, (1) a method of forming a two-layered resist pattern with a lower resist pattern and an upper resist pattern, by forming a lower resist layer of a resist material that mainly contains a one-component NQD novolak resist material, a hydrophobic one-component NQD novolak resist material or a polyhydroxystyrene resin on a substrate, by exposing the lower resist layer to light with a predetermined pattern, by forming an upper resist layer on the exposed lower resist layer, by exposing the upper resist layer to light with a predetermined pattern, and then by developing these upper and lower resist layers; and (2) a method of forming a two-layered resist pattern with a lower resist pattern, separator pattern and an upper resist pattern, by forming a lower resist layer of a resist material that mainly contains a positive resist material, a NQD novolak resist material, a one-component NQD novolak resist material, a hydrophobic one-component NQD novolak resist material or a polyhydroxystyrene resin on a substrate, by exposing the lower resist layer to light with a predetermined pattern, by forming a separator layer and an upper resist layer on the exposed lower resist layer, by exposing the upper resist layer to light with a predetermined pattern, and then by developing these upper and lower resist layers and by removing the separator layer.

However, according to the proposed method of (1), it is difficult to prevent an intermixing at the interface between the upper and lower resist layers. Even if the intermixing is prevented, deformation of the resist layers may occur due to the difference in their respective thermal shrinkages and thus the upper resist layer may come off or delaminate causing the yields to reduce.

According to the proposed method of (2), it is possible to prevent in principal an intermixing at the interface between the upper and lower resist layers. However, forming and removing of the separator layer are difficult. Also, deformation of the resist layer and the separator layer may occur due to the difference in their respective thermal shrinkages and thus the resist layer or the separator layer may come off or delaminate causing the yields to reduce.

SUMMARY OF THE INVENTION

It is therefore an object of the present invention to provide a method of forming a mask pattern and a patterning method using the mask pattern, whereby a thicker mask pattern can be formed without producing intermixing, deformation nor delamination of the resist layer.

Another object of the present invention is to provide a method of forming a mask pattern and a patterning method using the mask pattern, whereby a mask pattern with a desired cross section shape can be precisely formed even if the pattern has a high aspect ratio.

Further object of the present invention is to provide a method of forming a mask pattern and a patterning method using the mask pattern, whereby at least one via hole pattern with a steeper side wall can be formed.

According to the present invention, a method of forming a mask pattern includes a step of laminating a first resist layer on a base layer, a step of exposing the first resist layer using a first pattern with a pattern of at least one via hole, a step of developing the first resist layer exposed to remove a part of the first resist layer, the part corresponding to an area of the at least one via hole, a step of laminating a second resist layer on the first resist layer and on the base layer in the area of the at least one via hole, a step of exposing the second resist layer using a second pattern, and a step of developing the second resist layer exposed and the first resist layer to remove a part of the second resist layer and all of the first resist layer so as to form the mask pattern made of the second resist layer.

Because of a single layer of the second resist layer only, the mask pattern can be thickened without producing intermixing, deformation nor delamination of the resist layer. Furthermore, as the mask pattern is formed by using exposure process, an optional cross section shape can be precisely controlled. In addition, since no separator layer is used, fabrication process will become easy as the forming and removing processes of the separator layer are not required.

It is preferred that the first resist layer is made of a positive resist material, and that the method further includes a step of exposing whole surface area of the first resist layer after removing the part of the first resist layer, corresponding to the at least one via hole.

Also, according to the present invention, a method of forming a mask pattern includes a step of laminating a first resist layer on a base layer, a step of exposing the first resist layer using a first pattern with a pattern of at least one via hole, a step of developing the first resist layer exposed to remove a part of the first resist layer, the part corresponding to an area other than the at least one via hole, a step of laminating a non-reactive layer on the base layer in the area other than the at least one via hole, a step of laminating a second resist layer on the first resist layer and on the non-reactive layer, a step of exposing the second resist layer using a second pattern, a step of developing the second resist layer exposed to remove a part of the second resist layer, and a step of removing the non-reactive layer to form the mask pattern made of the first resist layer and the second resist layer.

The pattern can be thickened without producing intermixing, deformation nor delamination at the interface between the non-reactive layer and the resist layer. Furthermore, as the mask pattern is formed by using exposure process, an optional cross section shape can be precisely controlled. In addition, since no separator layer is used, fabrication process will become easy as the forming and removing processes of the separator layer are not required.

Further, according to the present invention, a method of forming a mask pattern includes a step of laminating a first resist layer on a base layer, a step of exposing the first resist layer using a first pattern with a pattern of at least one via hole, a step of developing the first resist layer exposed to remove a part of the first resist layer, the part corresponding to an area other than the at least one via hole, a step of laminating a non-reactive layer on the base layer in the area other than the at least one via hole, a step of removing a remaining part of the first resist layer, the remaining part corresponding to an area of the at least one via hole, a step of laminating a second resist layer on the base layer in the area of the at least one via hole and on the non-reactive layer, a step of exposing the second resist layer using a second pattern, a step of developing the second resist layer exposed to remove a part of the second resist layer, and a step of removing the non-reactive layer to form the mask pattern made of the second resist layer.

Because of a single layer of the second resist layer only, the mask pattern can be thickened without producing intermixing, deformation nor delamination of the resist layer. Furthermore, as the mask pattern is formed by using exposure process, an optional cross section shape can be precisely controlled. In addition, since no separator layer is used, fabrication process will become easy as the forming and removing processes of the separator layer are not required.

It is preferred that the non-reactive layer is made of a non-photosensitive organic material.

Still further, according to the present invention, a method of forming a mask pattern includes a step of laminating a resist layer on a base layer, a step of exposing the resist layer using a pattern of at least one via hole, a step of developing the resist layer exposed to remove a part of the resist layer, the part corresponding to an area of the at least one via hole, a step of plating a metal layer on the base layer in the area of the at least one via hole, the metal layer being thicker than that of the resist layer, and a step of developing the resist layer to remove the resist layer so as to form the mask pattern made of the metal layer.

Because of a single metal layer only, the mask pattern can be thickened without producing intermixing, deformation nor delamination of the resist layer. Furthermore, as the mask pattern is formed by using exposure process, an optional cross section shape can be precisely controlled. In addition, since no separator layer is used, fabrication process will become easy as the forming and removing processes of the separator layer are not required.

Further, according to the present invention, a method of forming a mask pattern includes a step of laminating a resist layer on a base layer, a step of exposing the resist layer using a pattern of at least one slit, a step of developing the resist layer exposed to remove a part of the resist layer, the part corresponding to an area of the at least one slit, a step of plating a metal layer on the base layer in the area of the at least one slit, the metal layer being thicker than that of the resist layer, and a step of developing the resist layer to remove the resist layer so as to form the mask pattern made of the metal layer.

Because of a single metal layer only, the mask pattern can be thickened without producing intermixing, deformation nor delamination of the resist layer. Furthermore, as the mask pattern is formed by using exposure process, an optional cross section shape can be precisely controlled. In addition, since no separator layer is used, fabrication process will become easy as the forming and removing processes of the separator layer are not required. Also, the metal layer mask has higher stiffness and higher heat-resistance than the resist layer mask, and can keep a high aspect ratio pattern.

Further, according to the present invention, a method of forming a mask pattern includes a step of laminating a first resist layer on a base layer, a step of exposing the first resist layer using a first pattern with a pattern of at least one via hole, a step of laminating a second resist layer of a photosensitive film resist on the first resist layer exposed, a step of exposing the second resist layer using a second pattern, a step of developing the second resist layer exposed to remove a part of the second resist layer, and a step of developing the first resist layer exposed to remove a part of the first resist layer so as to form the mask pattern made of the first resist layer and the second resist layer.

Since a photosensitive film resist is used as the second resist layer, the mask pattern can be thickened without producing intermixing, deformation nor delamination at the interface between the first and second resist layers. Furthermore, as the mask pattern is formed by using exposure process, an optional cross section shape can be precisely controlled. In addition, since no separator layer is used, fabrication process will become easy as the forming and removing processes of the separator layer are not required.

It is preferred that the method further includes a step of heating the second resist layer to slant end edges of an upper surface of the second resist layer after the developing step of the second resist layer, and that the developing step of the first resist layer is executed after the heating step of the second resist layer. Thus, a via hole pattern with a very steep side wall can be provided.

Still further, according to the present invention, a method of forming a mask pattern includes a step of laminating a first resist layer of a photosensitive film resist on a base layer, a step of exposing the first resist layer using a first pattern with a pattern of at least one via hole, a step of developing the first resist layer exposed to remove a part of the first resist layer, the part corresponding to an area other than the at least one via hole, a step of laminating a non-reactive layer on the base layer in the area other than the at least one via hole, a step of laminating a second resist layer on the first resist layer and on the non-reactive layer, a step of exposing the second resist layer using a second pattern, a step of developing the second resist layer exposed to remove a part of the second resist layer, and a step of removing the non-reactive layer to form the mask pattern made of the first resist layer and the second resist layer.

Since a photosensitive film resist is used as the first resist layer, the mask pattern can be thickened without producing intermixing, deformation nor delamination at the interface between the first and second resist layers. Furthermore, as the mask pattern is formed by using exposure process, an optional cross section shape can be precisely controlled. In addition, since no separator layer is used, fabrication process will become easy as the forming and removing processes of the separator layer are not required.

Further, according to the present invention, a method of forming a mask pattern includes a step of laminating a first resist layer of a photosensitive film resist on a base layer, a step of exposing the first resist layer using a first pattern with a pattern of at least one via hole, a step of developing the first resist layer exposed to remove a part of the first resist layer, the part corresponding to an area other than the at least one via hole, a step of laminating a non-reactive layer on the base layer in the area other than the at least one via hole, a step of laminating a second resist layer on the non-reactive layer, a step of exposing the second resist layer using a second pattern, a step of developing the second resist layer exposed to remove a part of the second resist layer, and a step of removing the non-reactive layer to form the mask pattern made of the first resist layer and the second resist layer.

Since a photosensitive film resist is used as the first resist layer, the mask pattern can be thickened without producing intermixing, deformation nor delamination at the interface between the first and second resist layers. Furthermore, as the mask pattern is formed by using exposure process, an optional cross section shape can be precisely controlled. In addition, since no separator layer is used, fabrication process will become easy as the forming and removing processes of the separator layer are not required.

It is preferred that the method further includes a step of heating the second resist layer to slant end edges of an upper surface of the second resist layer after the developing step of the second resist layer, and that the removing step of the non-reactive layer includes removing all of the non-reactive layer. Thus, a via hole pattern with a very steep side wall can be provided.

Further, according to the present invention, a method of forming a mask pattern includes a step of laminating a first resist layer of a photosensitive film resist on a base layer, a step of exposing the first resist layer using a first pattern with a pattern of at least one via hole, a step of laminating a separator layer and a second resist layer on the first resist layer exposed, a step of exposing the second resist layer using a second pattern, a step of developing the second resist layer exposed to remove a part of the second resist layer, a step of heating the second resist layer to slant end edges of an upper surface of the second resist layer, a step of removing a part of the separator layer, and a step of developing the first resist layer to remove a part of the first resist layer so as to form the mask pattern made of the first resist layer, the separator layer and the second resist layer.

Since end edges of an upper surface of the second resist layer are slanted by the heat treatment, a via hole pattern with a very steep side wall can be provided. Furthermore, as the separator layer is used, the mask pattern can be thickened without producing intermixing, deformation nor delamination at the interface between the first and second resist layers. Also, as the mask pattern is formed by using exposure process, an optional cross section shape can be precisely controlled.

Furthermore, according to the present invention, a method of forming a mask pattern includes a step of laminating a first resist layer of a photosensitive film resist on a base layer, a step of exposing the first resist layer using a first pattern with a pattern of at least one via hole, a step of developing the first resist layer exposed to remove a part of the first resist layer, the part corresponding to an area of the at least one via hole, a step of heating the first resist layer to slant end edges of the at least one via hole of an upper surface of the first resist layer, a step of laminating a separator layer on the first resist layer and on the base layer in the area of the at least one via hole, a step of laminating a second resist layer on the separator layer, a step of exposing the second resist layer using a second pattern, a step of developing the second resist layer exposed and the first resist layer to remove a part of the second resist layer, a step of heating the second resist layer to slant end edges of an upper surface of the second resist layer, a step of removing a part of the separator layer, and a step of removing all of the first resist layer to form the mask pattern made of the second resist layer.

Since end edges of an upper surface of the second resist layer are slanted by the heat treatment, a via hole pattern with a very steep side wall can be provided. Also, the slant upper surface edges can prevent possible hanging down of the second resist layer. Furthermore, as the separator layer is used, the mask pattern can be thickened without producing intermixing, deformation nor delamination at the interface between the first and second resist layers. Also, as the mask pattern is formed by using exposure process, an optional cross section shape can be precisely controlled.

Preferably, the aforementioned mask pattern has a lower portion and an upper portion wider than the lower portion.

According to the present invention, also, a patterning method of a thin film further includes a step of patterning the thin film using thus formed mask pattern, and a step of removing the mask pattern from the patterned thin-film. Furthermore, according to the present invention, a thin-film magnetic head may be fabricated by using the aforementioned patterning method.

Further objects and advantages of the present invention will be apparent from the following description of the preferred embodiments of the invention as illustrated in the accompanying drawings.

BRIEF DESCRIPTION OF THE DRAWINGS

FIGS. 2a to 2h show sectional views illustrating a thin-film forming process for patterning at least one via hole by using a lift-off method as a second embodiment according to the present invention;

FIGS. 8a to 8h show sectional views illustrating a thin-film forming process for patterning at least one via hole by using a lift-off method as a seventh embodiment according to the present invention;

DESCRIPTION OF THE PREFERRED EMBODIMENTS

FIGS. 1a to 1i illustrate a thin-film forming process for patterning at least one via hole by using a lift-off method as a first embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 1A:
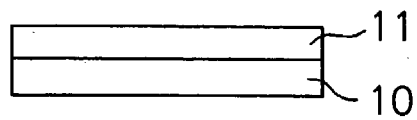
FIGS. 1a to 1i show sectional views illustrating a thin-film forming process for patterning at least one via hole by using a lift-off method as a first embodiment according to the present invention.

First, as shown in FIG. 1a, a first resist material is coated on a substrate or on a film (base layer) 10 on which at least one via hole is to be formed, and then pre-baked to form a first resist layer 11.

In this embodiment, a positive resist material is used for the first resist material. A thickness of the first resist layer 11 is 3–30 μm, for example 3 μm, but is not limited to this range.

Figure 1B:
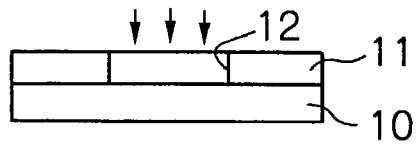

Then, as shown in FIG. 1b, a partial area of the resist layer 11, corresponding to at least one via hole 12, is exposed by using a mask with at least one opening that corresponds to the via hole.

Figure 1C:
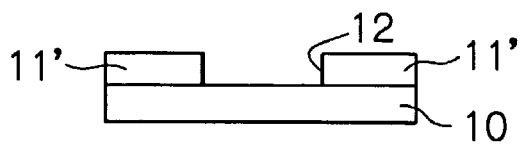

Then, as shown in FIG. 1c, the first resist layer 11 is developed to remove the partial area of the resist layer 11 corresponding to the via hole 12, and thus a patterned first resist layer 11' is formed.

Figure 1D:
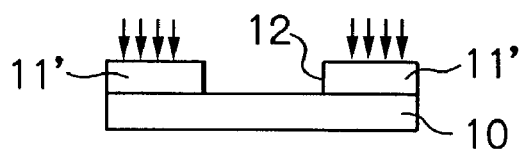

Then, as shown in FIG. 1d, the remaining area (a partial area other than the via hole 12) of the patterned first resist layer 11' is exposed.

Figure 1E:
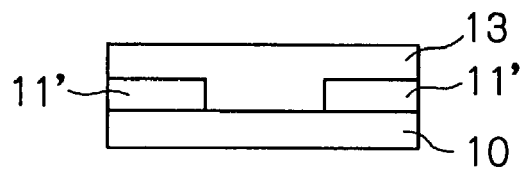

Then, as shown in FIG. 1e, a second resist material is coated on the patterned first resist layer 11' and on the base layer 10 in the via hole 12, and then pre-baked to form a second resist layer 13.

It is desired that the second resist material has a viscosity higher than that of the first resist material. If so, the second resist layer can be formed to have a larger thickness than the first resist layer. A positive resist material or a negative resist material can be used for the second resist material. In this embodiment, the second resist material is the positive resist material. If the negative resist material is used as for the second resist material, the exposing pattern should be inversed. A thickness of the second resist layer 13 is 3–30 μm, but is not limited to this range.

Figure 1F:
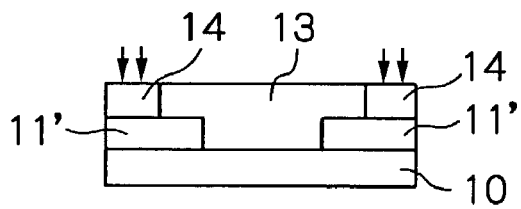

Then, as shown in FIG. 1f, a partial area to be removed 14 of the second resist layer 13 is exposed by using a mask with an opening corresponding to the area to be removed 14. In this embodiment, the partial area to be removed 14 is an area out of a circle with a larger diameter than that of the via hole 12. Therefore, a mask pattern finally formed will have a T-shaped cross section with a lower portion and an upper portion that is wider than the lower portion.

Figure 1G:
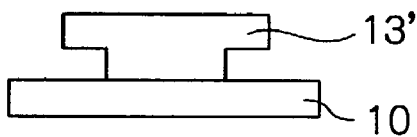

Then, the resist layers are developed, rinsed with water and dried to remove the partial area 14 of the second resist layer 13 and the first resist layer 11' so as to form a single layer mask pattern 13' of the second resist layer. This single layer mask pattern 13' has a T-shaped cross section with a lower portion and an upper portion that is wider than the lower portion as shown in FIG. 1g.

Figure 1H:
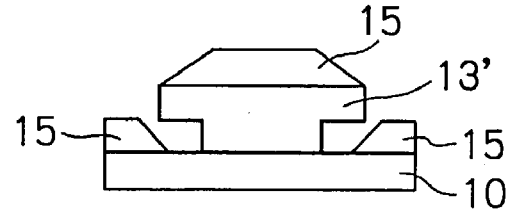

Thereafter, as shown in FIG. 1h, a film to be patterned 15 made of for example alumina is sputtered on the base layer 10 and the mask pattern 13'.

Figure 1I:
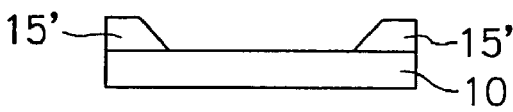

Then, the mask pattern 13' is dissolved by using an organic solvent such as acetone or NMP (N-methyl-2-pyrrolidone) to lift off the unnecessary area of the film to be patterned 15. Thus, as shown in FIG. 1i, a patterned thin-film 15' with a desired shape can be formed.

According to this first embodiment, since the mask pattern 13' is formed as a single layer of the second resist layer 11 only, the mask pattern can be thickened without producing intermixing, deformation nor delamination of the resist layer. As a result, when the patterning of for example at least one via hole is performed by the lift-off method with using this mask pattern, a relatively thick film with a desired good shape can be fabricated.

Also, because of the single layer mask pattern, problems occurred in the conventional two-layered resist mask pattern with the separator layer, such as deformation of the resist layer and the separator layer due to the difference in their respective thermal shrinkages and as delamination of the resist layer or the separator layer causing the yields to reduce may not occur.

In modifications of this embodiment, if there is a possibility of occurring an intermixing problem when a second resist material is coated on a first resist layer, a separator layer may be formed on the first resist layer after the patterning of the first resist layer.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 2a to 2h illustrate a thin-film forming process for patterning at least one via hole by using a lift-off method as a second embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 2A:
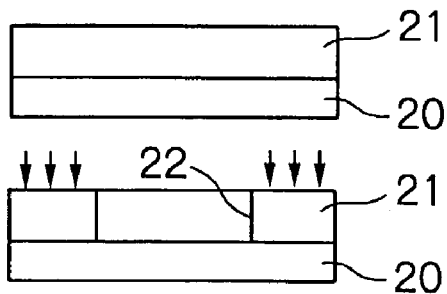

First, as shown in FIG. 2a, a first resist material is coated on a substrate or on a film (base layer) 20 on which at least one via hole is to be formed, and then pre-baked to form a first resist layer 21. A thickness of the first resist layer 21 is 3–30 µm, but is not limited to this range.

A positive resist material or a negative resist material can be used for the first resist material. In this embodiment, a positive resist material is used for the first resist material. If the negative resist material is used as for the first resist material, the exposing pattern should be inversed.

Then, as shown in FIG. 2b, a partial area of the resist layer 21, which is an area other than at least one via hole 22, is exposed by using a mask with an opening corresponding to the partial area out of the via hole 22.

Figure 2C:
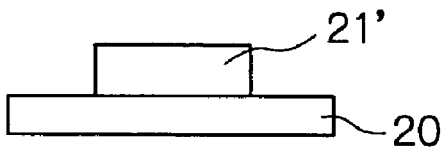

Then, as shown in FIG. 2c, the first resist layer 21 is developed to remove the partial area out of the via hole 22 of the resist layer 21, and thus a first resist layer 21' patterned to remain on the area of the via hole 22 is formed.

Figure 2D:
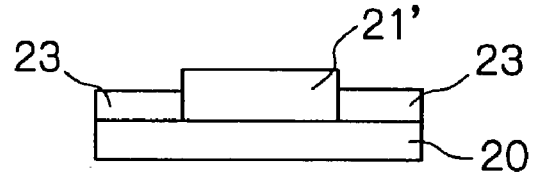

Then, as shown in FIG. 2d, a non-photosensitive organic material is coated on the partial area out of the first resist layer 21', namely on the base layer 20 out of the area for the via hole 22, to form a non-reactive layer 23.

A thickness of the non-reactive layer 23 is thinner than that of the first resist layer 21'. As for the non-photosensitive organic material, there are a polyvinyl alcohol resin, an ethyl acetate resin and Teflon resin for example. When coating, one of these resins dissolved in a particular solvent such as water or ethyl acetate is used.

Figure 2E:
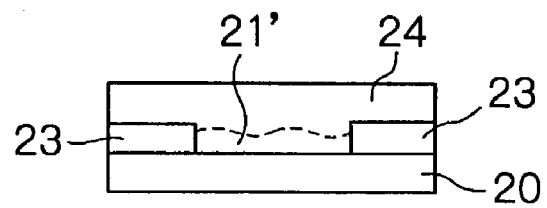

Then, as shown in FIG. 2e, a second resist material is coated on the patterned first resist layer 21' in the area for the via hole 22 and on the non-reactive layer 23, and then pre-baked to form a second resist layer 24.

A positive resist material or a negative resist material can be used for the second resist material. However, if the first resist material is the positive resist material, it is desired that the second resist material is also the positive resist material. In this embodiment, the second resist material is the positive resist material. If the negative resist material is used as for the second resist material, the exposing pattern should be inversed. A thickness of the second resist layer 24 is 3–30 µm, but is not limited to this range.

Even if the second resist layer 24 intermixes with the patterned first resist layer 21' as shown in FIGS. 2e to 2h, no trouble occurs. However, it is desired that no intermixing is occurred between the second resist layer 24 and the non-reactive layer 23. If there is a possibility of occurring an intermixing problem between the second resist layer 24 and the non-reactive layer 23, a separator layer is preferably formed on the non-reactive layer before the coating of the second resist material.

Figure 2F:
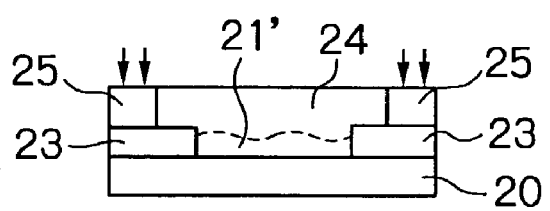

Then, as shown in FIG. 2f, a partial area to be removed 25 of the second resist layer 24 is exposed by using a mask with an opening corresponding to the area to be removed 25. In this embodiment, the partial area to be removed 25 is an area out of a circle with a larger diameter than that of the via hole 22. Therefore, a mask pattern finally formed will have a T-shaped cross section with a lower portion and an upper portion that is wider than the lower portion.

Figure 2G:
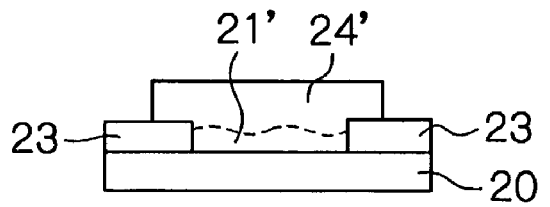
Figure 2H:
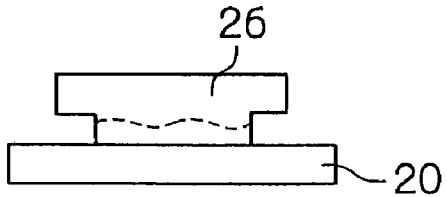

Then, the resist layers are developed, rinsed with water and dried to remove the partial area 25 of the second resist layer 24 as shown in FIG. 2g. Also, the non-reactive layer 23 is removed to form a mask pattern 26 of the second resist layer and the first resist layer. This mask pattern 26 has a T-shaped cross section with a lower portion and an upper portion that is wider than the lower portion as shown in FIG. 2h.

Then, a lift-off process using this mask pattern 26 is performed as well as in the first embodiment, and thus a patterned thin-film with a desired shape can be formed.

According to this second embodiment, since the non-reactive layer 23 is used, the mask pattern can be thickened without producing intermixing, deformation nor delamination between the non-reactive layer and the resist layer. As a result, when the patterning of for example at least one via hole is performed by the lift-off method with using this mask pattern, a relatively thick film with a desired good shape can be fabricated.

Also, because no separator layer is used, the manufacturing process will become easy as the forming and removing processes of the separator layer are not required.

In modifications of this embodiment, a third resist layer of a positive resist material may be formed instead of the non-reactive layer of the non-photosensitive organic material.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 3a to 3i illustrate a thin-film forming process for patterning at least one via hole by using a lift-off method as a third embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 3A:
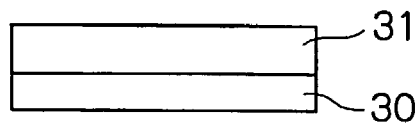
FIGS. 3a to 3i show sectional views illustrating a thin-film forming process for patterning at least one via hole by using a lift-off method as a third embodiment according to the present invention.

First, as shown in FIG. 3a, a first resist material is coated on a substrate or on a film (base layer) 30 on which at least one via hole is to be formed, and then pre-baked to form a first resist layer 31.

A positive resist material or a negative resist material can be used for the first resist material. In this embodiment, a positive resist material is used for the first resist material. If the negative resist material is used as for the first resist material, the exposing pattern should be inversed. A thickness of the first resist layer 31 is 3–30 µm, but is not limited to this range.

Figure 3B:
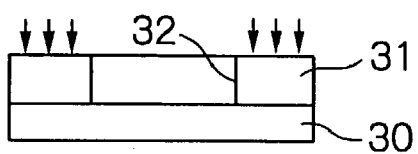

Then, as shown in FIG. 3b, a partial area of the resist layer 31, which is an area other than at least one via hole 32, is exposed by using a mask with an opening corresponding to the partial area out of the via hole 32.

Figure 3C:
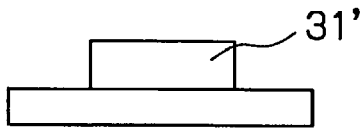

Then, as shown in FIG. 3c, the first resist layer 31 is developed to remove the partial area out of the via hole 32 of the resist layer 31, and thus a first resist layer 31' patterned to remain on the area of the via hole 32 is formed.

Figure 3D:
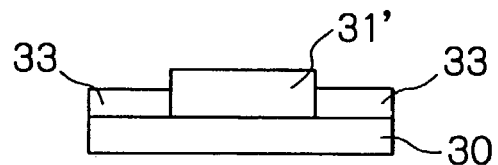

Then, as shown in FIG. 3d, a non-photosensitive organic material is coated on the partial area out of the first resist layer 31', namely on the base layer 30 out of the area for the via hole 32, to form a non-reactive layer 33.

A thickness of the non-reactive layer 33 is thinner than that of the first resist layer 31'. As for the non-photosensitive organic material, there are a polyvinyl alcohol resin, an ethyl acetate resin and Teflon resin for example. When coating, one of these resins dissolved in a particular solvent such as water or ethyl acetate is used.

Figure 3E:
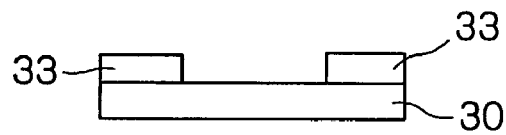

Then, as shown in FIG. 3e, all of the first resist layer 31' is removed by for example exposure and development of the whole first resist layer 31'.

Figure 3F:
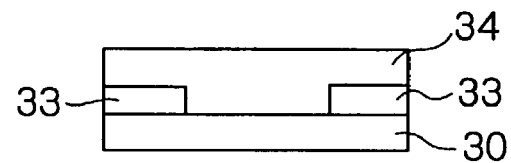

Then, as shown in FIG. 3f, a second resist material is coated on the base layer 30 in the area for the via hole 32 and on the non-reactive layer 33, and then pre-baked to form a second resist layer 34.

A positive resist material or a negative resist material can be used for the second resist material. In this embodiment, the second resist material is the positive resist material. If the negative resist material is used as for the second resist material, the exposing pattern should be inversed. A thickness of the second resist layer 34 is 3–30 µm, but is not limited to this range.

Figure 3G:
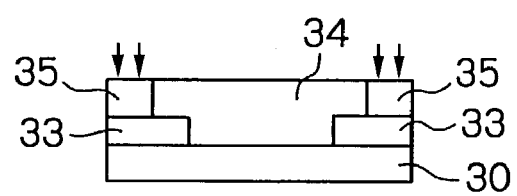

Then, as shown in FIG. 3g, a partial area to be removed 35 of the second resist layer 34 is exposed by using a mask with an opening corresponding to the area to be removed 35. In this embodiment, the partial area to be removed 35 is an area out of a circle with a larger diameter than that of the via hole 32. Therefore, a mask pattern finally formed will have a T-shaped cross section with a lower portion and an upper portion that is wider than the lower portion.

Figure 3H:
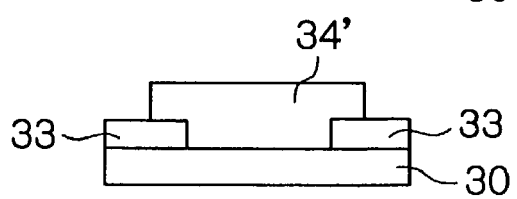
Figure 3I:
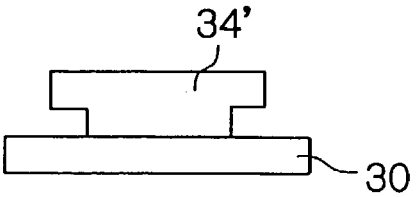

Then, the resist layers are developed, rinsed with water and dried to remove the partial area 35 of the second resist layer 34 as shown in FIG. 3h. Also, the non-reactive layer 33 is removed to form a single layer mask pattern 34' of the second resist layer. This single layer mask pattern 34' has a T-shaped cross section with a lower portion and an upper portion that is wider than the lower portion as shown in FIG. 3i.

Then, a lift-off process using this mask pattern 34' is performed as well as in the first embodiment, and thus a patterned thin-film with a desired shape can be formed.

According to this third embodiment, since the non-reactive layer 33 is used, the mask pattern can be thickened without producing intermixing, deformation nor delamination between the non-reactive layer and the resist layer. Also, since the mask pattern 34' is formed as a single layer of the second resist layer only, the mask pattern can be thickened without producing intermixing, deformation nor delamination of the resist layer. As a result, when the patterning of for example at least one via hole is performed by the lift-off method with using this mask pattern, a relatively thick film with a desired good shape can be fabricated.

Also, because no separator layer is used, the manufacturing process will become easy as the forming and removing processes of the separator layer are not required.

In modifications of this embodiment, a third resist layer of a positive resist material may be formed instead of the non-reactive layer of the non-photosensitive organic material.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 4a to 4g illustrate a thin-film forming process for patterning at least one via hole by using a lift-off method as a fourth embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 4A:
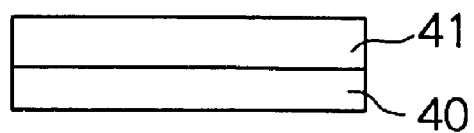
FIGS. 4a to 4g show sectional views illustrating a thin-film forming process for patterning at least one via hole by using a lift-off method as a fourth embodiment according to the present invention.

First, as shown in FIG. 4a, a resist material is coated on a substrate or on a film (base layer) 40 on which at least one via hole is to be formed, and then pre-baked to form a resist layer 41.

A positive resist material or a negative resist material can be used for the resist material. In this embodiment, the resist material is the positive resist material. If the negative resist material is used as for the resist material, the exposing pattern should be inversed. A thickness of the resist layer 41 is 3–30 µm, but is not limited to this range.

Figure 4B:
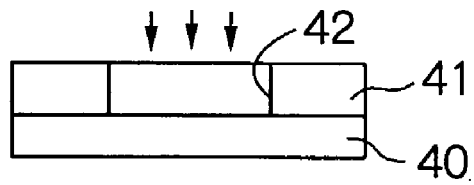

Then, as shown in FIG. 4b, a partial area of the resist layer 41, corresponding to at least one via hole 42, is exposed by using a mask with at least one opening that corresponds to the via hole.

Figure 4C:
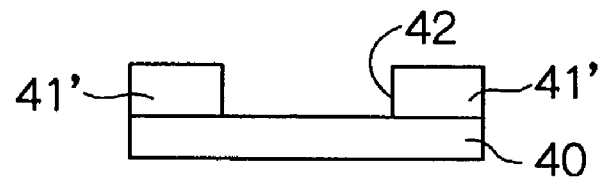

Then, as shown in FIG. 4c, the resist layer 41 is developed to remove the partial area of the resist layer 41 corresponding to the via hole 42, and thus a patterned resist layer 41' is formed.

Figure 4D:
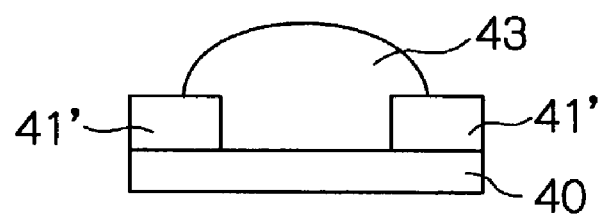

Then, as shown in FIG. 4d, a metal material such as a copper is plated in the via hole 42 to form a metal layer 43. In this case, an electrode film (not shown) used for plating is preliminarily deposited on the base layer 40, and then the metal layer 43 is grown on the electrode film by plating. By plating the metal layer to grow thicker than the resist layer 41', the metal layer 43 with a mushroom cross section shown in the figure will be formed.

Figure 4E:
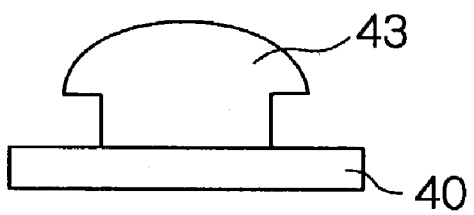

Then, as shown in FIG. 4e, the resist layer 41' is removed to form a single-layer mask pattern 43 of the metal layer. This single-layer metal mask pattern 43 has a T-shaped cross section with a lower portion and an upper portion that is wider than the lower portion. The electrode film used for plating will be removed by dry etching for example.

Figure 4F:
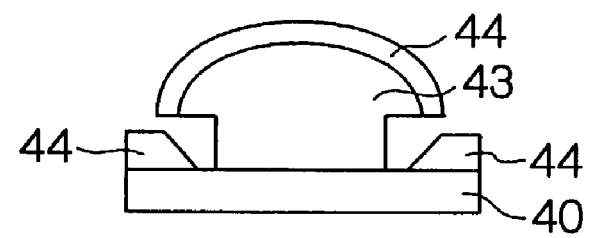

Thereafter, as shown in FIG. 4f, a film to be patterned 44 made of for example alumina is sputtered on the base layer 40 and the mask pattern 43.

Figure 4G:
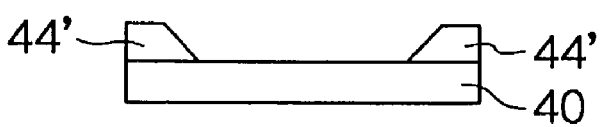

Then, the mask pattern 43 is dissolved by wet-etching to lift off the unnecessary area of the film to be patterned 44. Thus, as shown in FIG. 4g, a patterned thin-film 44' with a desired shape can be formed.

According to this fourth embodiment, since the mask pattern 43 is formed as a single metal layer, the mask pattern can be thickened without producing intermixing, deformation nor delamination of the resist layer. As a result, when the patterning of for example at least one via hole is performed by the lift-off method with using this mask pattern, a relatively thick film with a desired good shape can be fabricated.

Also, since the mask pattern 43 is formed by the single patterning process, the manufacturing process can be simplified. Furthermore, because of the metal mask pattern, no separator layer is required. Thus, the manufacturing process to become easy as no forming and removing processes of the separator layer are necessary.

In modifications of this embodiment, a non-reactive layer of a non-photosensitive organic material may be used instead of the resist layer.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

Figure 5:
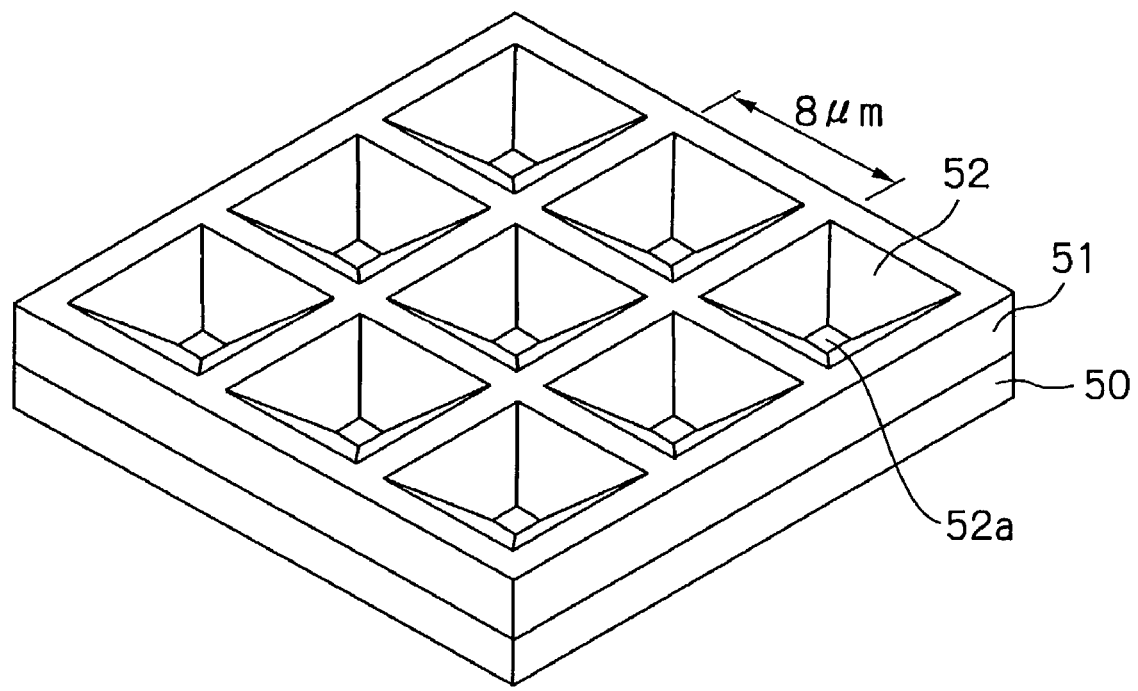
FIG. 5 shows a perspective view illustrating a thin-film pattern formed in the fourth embodiment shown in FIGS. 4a to 4g.

If a plurality of mask patterns arranged in matrix are formed according to the method of this embodiment and a liftoff technique is performed, a thin-film pattern with a group of micro spaces or via holes with a high aspect ratio and a narrow pitch as shown in FIG. 5 can be fabricated. This is because the metal mask pattern has a better adhesion with respect to a substrate than the resist mask pattern and has itself a high stiffness and therefore the lower portion of the undercut can be formed with keeping a high aspect ratio. In FIG. 5, reference numeral 50 denotes the substrate, and 51 denotes the thin-film pattern of alumina for example formed on the substrate 50 by the lift-off method. Although it is just an example, a thickness of the thin-film pattern 51 is 3 μm, a pitch thereof is 8 μm, and a size of a rectangular bottom plane 52a of each via hole 52 is 0.6 μm×0.6 μm.

FIGS. 6a to 6g illustrate a thin-film forming process for patterning an isolated space or an isolated slit by using a lift-off method as a fifth embodiment according to the present invention.

Figure 6A:
FIGS. 6a to 6g show sectional views illustrating a thin-film forming process for patterning an isolated space or slit by using a lift-off method as a fifth embodiment according to the present invention.

First, as shown in FIG. 6a, a resist material is coated on a substrate or on a film (base layer) 60 on which a slit is to be formed, and then pre-baked to form a resist layer 61.

A positive resist material or a negative resist material can be used for the resist material. In this embodiment, the resist material is the positive resist material. If the negative resist material is used as for the resist material, the exposing pattern should be inversed. A thickness of the resist layer 61 is 3–30 μm, but is not limited to this range.

Figure 6B:
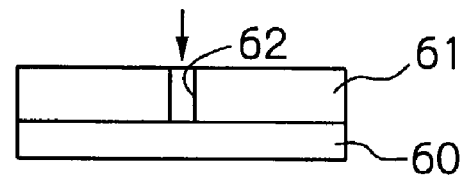

Then, as shown in FIG. 6b, a partial area of the resist layer 61, corresponding to a slit 62, is exposed by using a mask with an opening that corresponds to the slit.

Figure 6C:
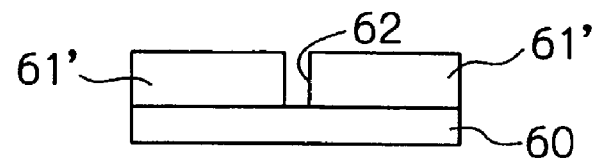

Then, as shown in FIG. 6c, the resist layer 61 is developed to remove the partial area of the resist layer 61 corresponding to the slit 62, and thus a patterned resist layer 61' is formed.

Figure 6D:
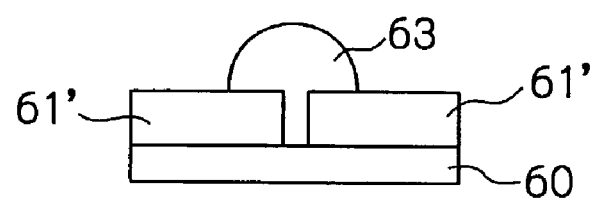

Then, as shown in FIG. 6d, a metal material such as a copper is plated in the slit 62 to form a metal layer 63. In this case, an electrode film (not shown) used for plating is preliminarily deposited on the base layer 60, and then the metal layer 63 is grown on the electrode film by plating. By plating the metal layer to grow thicker than the resist layer 61', the metal layer 63 with a mushroom cross section shown in the figure will be formed.

Figure 6E:
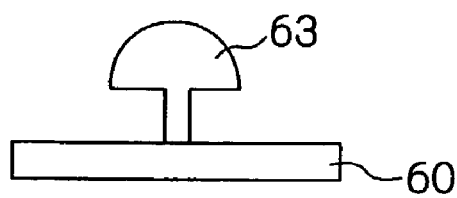

Then, as shown in FIG. 6e, the resist layer 61' is removed to form a single-layer metal mask pattern 63 with a high aspect ratio. This single-layer metal mask pattern 63 has a T-shaped cross section with a lower portion and an upper portion that is wider than the lower portion. The electrode film used for plating will be removed by dry etching for example.

Figure 6F:
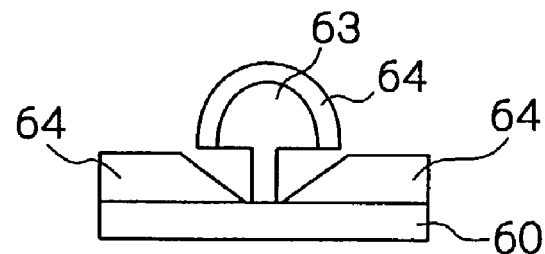

Thereafter, as shown in FIG. 6f, a film to be patterned 64 made of for example alumina is sputtered on the base layer 60 and the mask pattern 63.

Figure 6G:
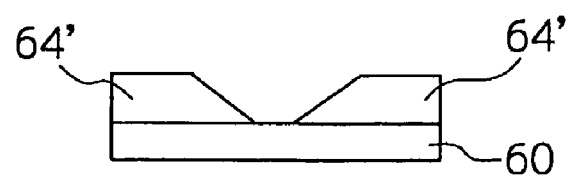

Then, the mask pattern 63 is dissolved by wet-etching to lift off the unnecessary area of the film to be patterned 64. Thus, as shown in FIG. 6g, a patterned thin-film 64' with a desired shape can be formed.

According to this fifth embodiment, since the mask pattern 63 is formed as a single metal layer, the mask pattern can be thickened without producing intermixing, deformation nor delamination of the resist layer. As a result, when the patterning of for example an isolated slit is performed by the lift-off method with using this mask pattern, a relatively thick film with a desired good shape can be fabricated. Particularly, because the metal mask pattern 63 has a better adhesion with respect to the bas layer 60 than the resist mask pattern and has itself a high stiffness, the lower portion of the undercut can be formed with keeping a high aspect ratio. As a result, a thin-film pattern with a patterned isolated space or slit with a high aspect ratio and a narrow pitch can be fabricated.

Also, since the mask pattern 63 is formed by the single patterning process, the manufacturing process can be simplified. Furthermore, because of the metal mask pattern, no separator layer is required. Thus, the manufacturing process to become easy as no forming and removing processes of the separator layer are necessary.

In modifications of this embodiment, a non-reactive layer of a non-photosensitive organic material may be used instead of the resist layer.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 7a to 7f illustrate a thin-film forming process for patterning a plurality of lines and spaces or slits by using a lift-off method as a sixth embodiment according to the present invention.

Figure 7A:
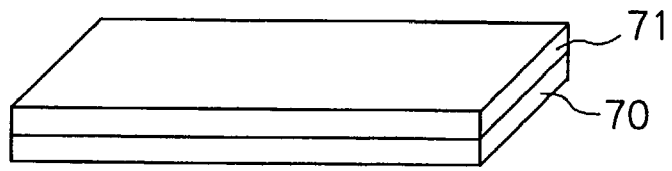
FIGS. 7a to 7f show sectional views illustrating a thin-film forming process for patterning a plurality of lines and spaces or slits by using a lift-off method as a sixth embodiment according to the present invention.

First, as shown in FIG. 7a, a resist material is coated on a substrate or on a film (base layer) 70 on which slits are to be formed, and then pre-baked to form a resist layer 71.

A positive resist material or a negative resist material can be used for the resist material. In this embodiment, the resist material is the positive resist material. If the negative resist material is used as for the resist material, the exposing pattern should be inversed. A thickness of the resist layer 71 is 3–30 μm, but is not limited to this range.

Figure 7B:
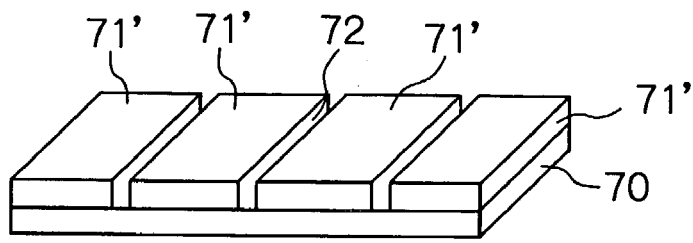

Then, as shown in FIG. 7b, partial areas of the resist layer 71, corresponding to a plurality of slits 72 arranged in parallel each other, are exposed by using a mask with an opening that corresponds to the slits, then developed to remove the partial areas of the resist layer 71 corresponding to the slits 72, and thus a patterned resist layer 71' is formed.

Figure 7C:
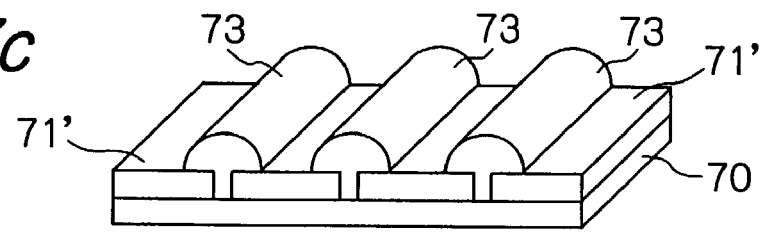

Then, as shown in FIG. 7c, a metal material such as a copper is plated in the plurality of slits 72 to form a plurality of metal layers 73 arranged in parallel each other. In this case, electrode films (not shown) used for plating are preliminarily deposited on the base layer 70, and then the metal layers 73 are grown on the electrode films by plating. By plating the metal layers to grow thicker than the resist layer 71', the metal layers 73 each having a mushroom cross section shown in the figure will be formed.

Figure 7D:
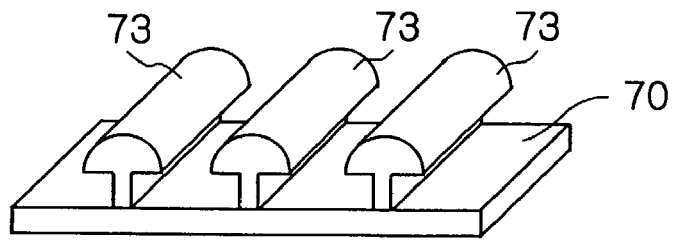

Then, as shown in FIG. 7d, the resist layer 71' is removed to form a plurality of single-layer metal mask patterns 73 each having a high aspect ratio. Each of the single-layer metal mask patterns 73 has a T-shaped cross section with a lower portion and an upper portion that is wider than the lower portion. The electrode films used for plating will be removed by dry etching for example.

Figure 7E:
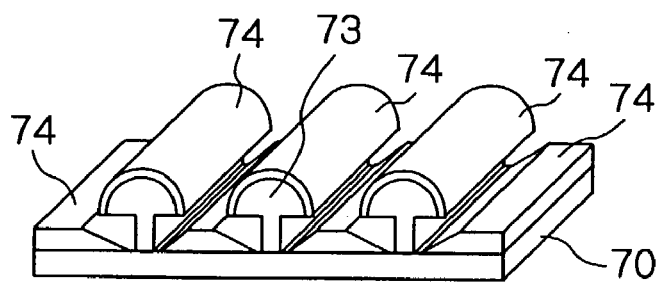

Thereafter, as shown in FIG. 7e, a film to be patterned 74 made of for example alumina is sputtered on the base layer 70 and the mask patterns 73.

Figure 7F:
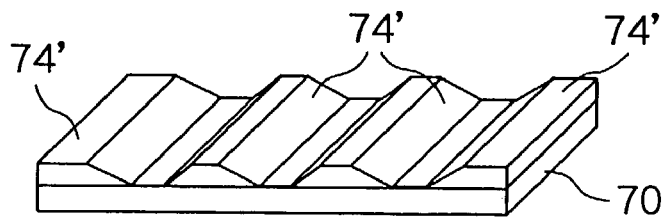

Then, the mask patterns 73 are dissolved by wet-etching to lift off the unnecessary area of the film to be patterned 74. Thus, as shown in FIG. 7f, a patterned thin-film 74' with a desired shape can be formed.

According to this sixth embodiment, since each of the mask patterns 73 is formed as a single metal layer, the mask patterns can be thickened without producing intermixing, deformation nor delamination of the resist layer. As a result, when the patterning of for example slits is performed by the lift-off method with using the mask patterns, a relatively thick film with a desired good shape can be fabricated. Particularly, because the metal mask patterns 73 have a better adhesion with respect to the bas layer 70 than the resist mask pattern and have themselves a high stiffness, the lower portion of the undercut can be formed with keeping a high aspect ratio. As a result, a thin-film pattern having a plurality of lines and spaces or slits with a high aspect ratio and a narrow pitch can be fabricated.

Also, since the mask pattern 73 is formed by the single patterning process, the manufacturing process can be simplified. Furthermore, because of the metal mask pattern, no separator layer is required. Thus, the manufacturing process to become easy as no forming and removing processes of the separator layer are necessary.

In modifications of this embodiment, a non-reactive layer of a non-photosensitive organic material may be used instead of the resist layer.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 8a to 8h illustrate a thin-film forming process for patterning at least one via hole by using a lift-off method as a seventh embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 8A:
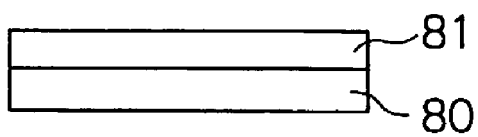

First, as shown in FIG. 8a, a first resist material is coated on a substrate or on a film (base layer) 80 on which at least one via hole is to be formed, and then pre-baked to form a first resist layer 81.

A positive resist material is preferably used for the first resist material. However, a negative resist material can be used as the first resist material in case that the resist layer made of the first resist material will not be exposed during the exposure process of a second resist layer. In this embodiment, a positive resist material is used for the first resist material. If the negative resist material is used as for the first resist material, the exposing pattern should be inversed. A thickness of the first resist layer 81 is 3–30 µm, but is not limited to this range.

Figure 8B:
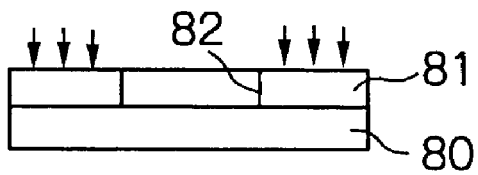

Then, as shown in FIG. 8b, a partial area of the first resist layer 81, which is an area other than at least one via hole 82, is exposed by using a mask with an opening corresponding to the partial area out of the via hole 82.

Figure 8C:
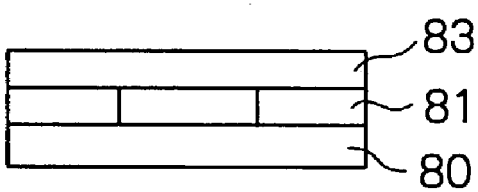

Then, as shown in FIG. 8c, a photosensitive film resist as for a second resist material is laminated on the first resist layer 81 to form a second resist layer 83. A positive resist material is preferably used for the photosensitive film resist material, but a negative resist material can be used. In this embodiment, the resist material is the positive resist material. If the negative resist material is used as for the second resist material, the exposing pattern should be inversed. Also, in this case, the negative resist material should be selected to a material with a different sensitivity wave-length from that of the first resist layer 81, or a coating or a film for intercepting light of a sensitivity wave-length of the first resist layer 81 should be laminated on this first resist layer before the negative photosensitive film resist is adhered thereon. A thickness of the second resist layer 83 of the photosensitive film resist is 30–100 µm, but is not limited to this range.

Then, as shown in FIG. 8d, a partial area to be removed 84 of the second resist layer 83 is exposed by using a mask with an opening corresponding to the area to be removed 84. In this embodiment, the partial area to be removed 84 is an area out of a circle with a larger diameter than that of the via hole 82. Therefore, a mask pattern finally formed will have a T-shaped cross section with a lower portion and an upper portion that is wider than the lower portion.

Figure 8E:
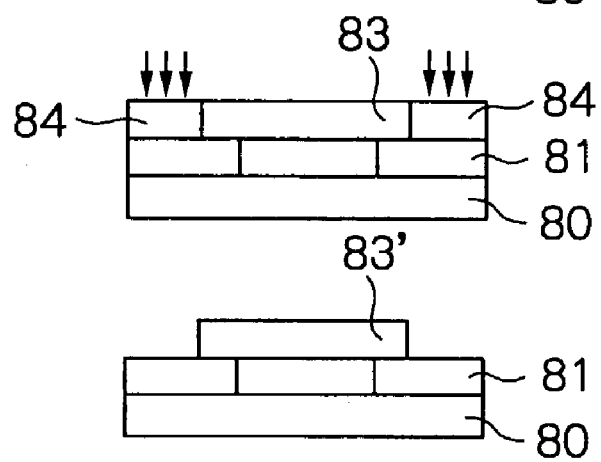
Figure 8F:
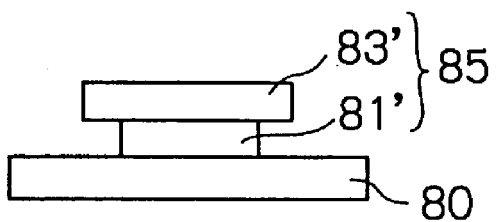

Then, a first development is performed to remove the partial area 84 of the second resist layer 83 and to form the patterned second resist layer 83' as shown in FIG. 8e. Thereafter, a second development is performed to remove the partial area of the first resist layer 81, which is an area other than the via hole 82, and to form the patterned first resist layer 81'. Thus, a mask pattern 85 having a T-shaped cross section of the lower patterned first resist layer 81' and the upper patterned second resist layer 83' that is wider than the lower resist layer 81' as shown in FIG. 8f is formed.

Figure 8G:
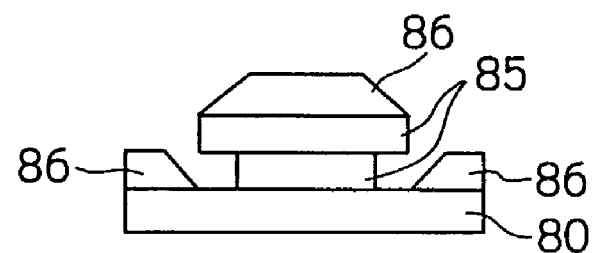

Thereafter, as shown in FIG. 8g, a film to be patterned 86 made of for example alumina is sputtered on the base layer 80 and the mask pattern 85.

Figure 8H:
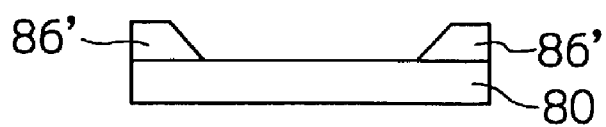

Then, the mask pattern 85 is dissolved by using an organic solvent such as acetone or NMP (N-methyl-2-pyrrolidone) to lift off the unnecessary area of the film to be patterned 86. Thus, as shown in FIG. 8h, a patterned thin-film 86' with a desired shape can be formed.

According to this seventh embodiment, since the photosensitive film resist is used for the second resist layer 83, the mask pattern can be thickened without producing intermixing, deformation nor delamination of the first resist layer 81. As a result, when the patterning of for example at least one via hole is performed by the lift-off method with using this mask pattern, a relatively thick film with a desired good shape can be fabricated.

Also, because no separator layer is used, the manufacturing process will become easy as the forming and removing processes of the separator layer are not required. Further, since a coating type resist material is used for the first resist layer, a mask pattern capable of keeping a high adhesion to a base layer with projections and depressions can be provided.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 9a to 9h illustrate a thin-film forming process for patterning at least one via hole by using a lift-off method as an eighth embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 9A:
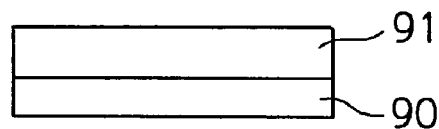
FIGS. 9a to 9h show sectional views illustrating a thin-film forming process for patterning at least one via hole by using a lift-off method as an eighth embodiment according to the present invention.

First, as shown in FIG. 9a, a photosensitive film resist as for a first resist material is laminated on a substrate or on a film (base layer) 90 on which at least one via hole is to be formed, to form a first resist layer 91.

Although a positive resist material is preferably used for the photosensitive resist film, a negative resist material can be used. In this embodiment, a positive resist material is used for the first resist material. If the negative resist material is used as for the first resist material, the exposing pattern should be inversed. A thickness of the first resist layer 91 made of the photosensitive film resist is 30–100 μm, but is not limited to this range.

Figure 9B:
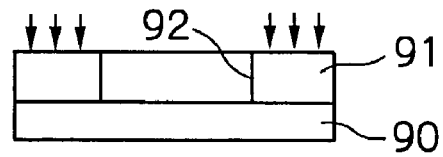

Then, as shown in FIG. 9b, a partial area of the resist layer 91, which is an area other than at least one via hole 92, is exposed by using a mask with an opening corresponding to the partial area out of the via hole 92.

Figure 9C:
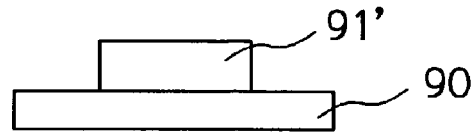

Then, as shown in FIG. 9c, the first resist layer 91 is developed to remove the partial area out of the via hole 92 of the resist layer 91, and thus a first resist layer 91' patterned to remain on the area of the via hole 92 is formed.

Figure 9D:
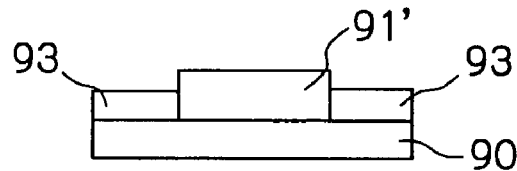

Then, as shown in FIG. 9d, a non-photosensitive organic material is coated on the partial area out of the first resist layer 91', namely on the base layer 90 out of the area for the via hole 92, to form a non-reactive layer 93.

A thickness of the non-reactive layer 93 is thinner than that of the first resist layer 91'. As for the non-photosensitive organic material, there are a polyvinyl alcohol resin, an ethyl acetate resin and Teflon resin for example. When coating, one of these resins dissolved in a particular solvent such as water or ethyl acetate is used.

Figure 9E:
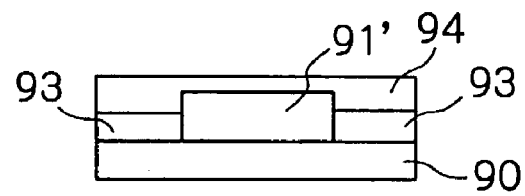

Then, as shown in FIG. 9e, a second resist material is coated on the patterned first resist layer 91' in the area for the via hole 92 and on the non-reactive layer 93, and then pre-baked to form a second resist layer 94.

A positive resist material or a negative resist material can be used for the second resist material. In this embodiment, the second resist material is the positive resist material. If the negative resist material is used as for the second resist material, the exposing pattern should be inversed. A thickness of the second resist layer 94 is 3–30 μm, but is not limited to this range.

Figure 9F:
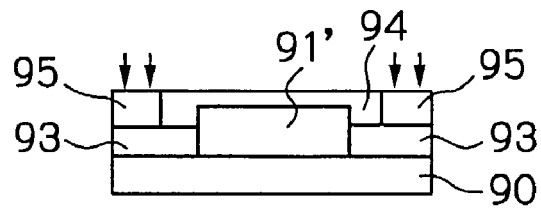

Then, as shown in FIG. 9f, a partial area to be removed 95 of the second resist layer 94 is exposed by using a mask with an opening corresponding to the area to be removed 95. In this embodiment, the partial area to be removed 95 is an area out of a circle with a larger diameter than that of the via hole 92. Therefore, a mask pattern finally formed will have a T-shaped cross section with a lower portion and an upper portion that is wider than the lower portion.

Figure 9G:
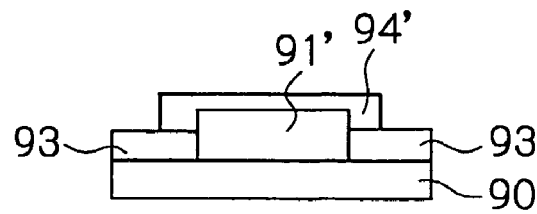
Figure 9H:
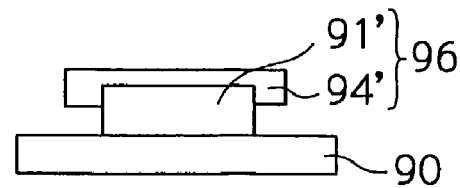

Then, the resist layers are developed, rinsed with water and dried to remove the partial area 95 of the second resist layer 94 as shown in FIG. 9g. Also, the non-reactive layer 93 is removed. Thus, a mask pattern 96 having a T-shaped cross section with the patterned lower first resist layer 91' and the patterned upper second resist layer 94' that is wider than the lower first resist layer 91' as shown in FIG. 9h is formed.

Then, a lift-off process using this mask pattern 96 is performed as well as in the first embodiment, and thus a patterned thin-film with a desired shape can be formed.

According to this eighth embodiment, since the photosensitive film resist is used for the first resist layer 91, the mask pattern can be thickened without producing intermixing, deformation nor delamination of the second resist layer 94. Also, since the non-reactive layer 93 is used, the mask pattern can be thickened without producing intermixing, deformation nor delamination between the non-reactive layer and the resist layer. As a result, when the patterning of for example at least one via hole is performed by the lift-off method with using this mask pattern, a relatively thick film with a desired good shape can be fabricated.

Also, because no separator layer is used, the manufacturing process will become easy as the forming and removing processes of the separator layer are not required.

In modifications of this embodiment, a third resist layer of a positive resist material may be formed instead of the non-reactive layer of the non-photosensitive organic material.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 10a to 10h illustrate a thin-film forming process for patterning at least one via hole by using a lift-off method as a ninth embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 10A:
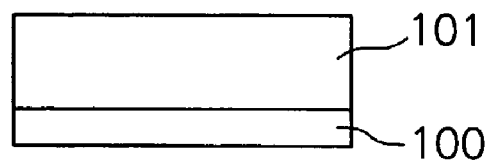
FIGS. 10a to 10h show sectional views illustrating a thin-film forming process for patterning at least one via hole by using a lift-off method as a ninth embodiment according to the present invention.

First, as shown in FIG. 10a, a photosensitive film resist as for a first resist material is laminated on a substrate or on a film (base layer) 100 on which at least one via hole is to be formed, to form a first resist layer 101. In this embodiment, a thickness of the first resist layer 101 made of the photosensitive film resist is larger than a total thickness of a non-reactive layer 103 and a second resist layer 104 described later.

Although a positive resist material is preferably used for the photosensitive resist film, a negative resist material can be used. In this embodiment, a positive resist material is used for the first resist material. If the negative resist material is used as for the first resist material, the exposing pattern should be inversed. A thickness of the first resist layer 101 made of the photosensitive film resist is 30–100 µm, but is not limited to this range.

Figure 10B:
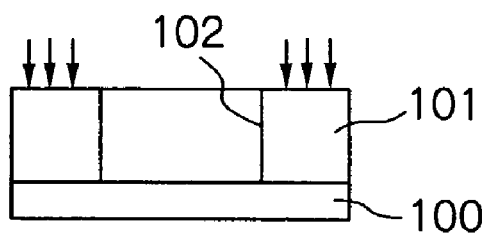

Then, as shown in FIG. 10b, a partial area of the resist layer 101, which is an area other than at least one via hole 102, is exposed by using a mask with an opening corresponding to the partial area out of the via hole 102.

Figure 10C:
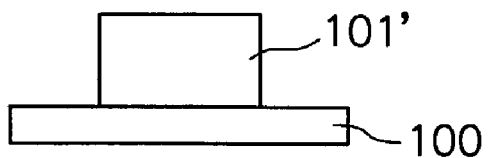

Then, as shown in FIG. 10c, the first resist layer 101 is developed to remove the partial area out of the via hole 102 of the resist layer 101, and thus a first resist layer 101' patterned to remain on the area of the via hole 102 is formed.

Figure 10D:
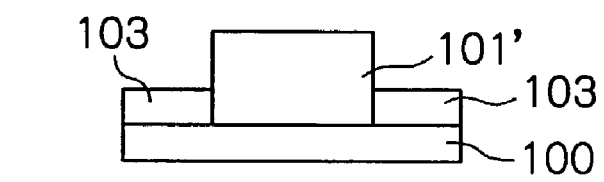

Then, as shown in FIG. 10d, a non-photosensitive organic material is coated on the partial area out of the first resist layer 101', namely on the base layer 100 out of the area for the via hole 102, to form the non-reactive layer 103.

As for the non-photosensitive organic material, there are a polyvinyl alcohol resin, an ethyl acetate resin and Teflon resin for example. When coating, one of these resins dissolved in a particular solvent such as water or ethyl acetate is used.

Figure 10E:
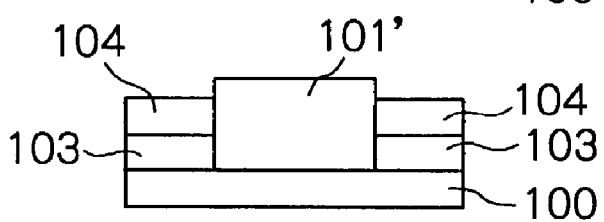

Then, as shown in FIG. 10e, a second resist material is coated on the non-reactive layer 103, and then pre-baked to form the second resist layer 104.

A positive resist material or a negative resist material can be used for the second resist material. In this embodiment, the second resist material is the positive resist material. If the negative resist material is used as for the second resist material, the exposing pattern should be inversed. A thickness of the second resist layer 104 is 3–30 µm, but is not limited to this range.

Figure 10F:
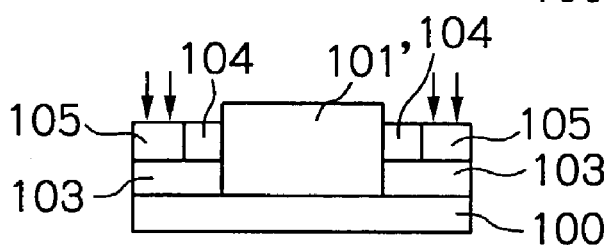

Then, as shown in FIG. 10f, a partial area to be removed 105 of the second resist layer 104 is exposed by using a mask with an opening corresponding to the area to be removed 105.

Figure 10G:
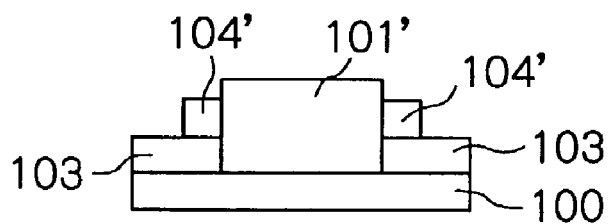
Figure 10H:
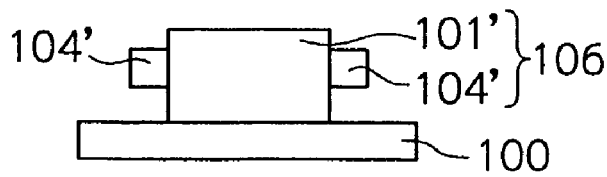

Then, the resist layers are developed, rinsed with water and dried to remove the partial area 105 of the second resist layer 104 as shown in FIG. 10g. Also, the non-reactive layer 103 is removed. Thus, a mask pattern 106 patterned to have a cross section of the first resist layer 101' and the second resist layer 104' that is wider than the first resist layer 101' as shown in FIG. 10h is formed.

Then, a lift-off process using this mask pattern 106 is performed as well as in the first embodiment, and thus a patterned thin-film with a desired shape can be formed.

According to this ninth embodiment, since the photosensitive film resist is used for the first resist layer 101, the mask pattern can be thickened without producing intermixing, deformation nor delamination of the second resist layer 104. Also, since the non-reactive layer 103 is used, the mask pattern can be thickened without producing intermixing, deformation nor delamination between the non-reactive layer and the resist layer. As a result, when the patterning of for example at least one via hole is performed by the lift-off method with using this mask pattern, a relatively thick film with a desired good shape can be fabricated.

Also, because no separator layer is used, the manufacturing process will become easy as the forming and removing processes of the separator layer are not required.

In modifications of this embodiment, a third resist layer of a positive resist material may be formed instead of the non-reactive layer of the non-photosensitive organic material.

Furthermore, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 11a to 11k illustrate a thin-film forming process for patterning at least one via hole by using a lift-off method as a tenth embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 11A:
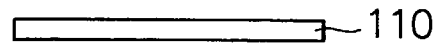
FIGS. 11a to 11k show sectional views illustrating a thin-film forming process for patterning at least one via hole by using a lift-off method as a tenth embodiment according to the present invention.

First, as shown in FIG. 11a, a substrate or on a film (base layer) 110 on which at least one via hole is to be formed is provided.

Figure 11B:
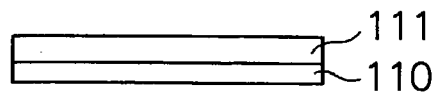

Then, as shown in FIG. 11b, a first resist material is coated on the base layer 110, and then pre-baked to form a first resist layer 111.

A positive resist material or a negative resist material can be used as the first resist material. In this embodiment, a positive resist material is used for the first resist material. If the negative resist material is used as for the first resist material, the exposing pattern should be inversed. A thickness of the first resist layer 111 is 3–30 µm, for example 3 µm, but is not limited to this range.

Figure 11C:
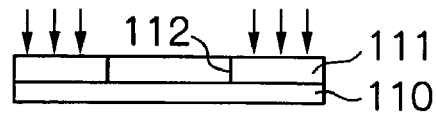

Then, as shown in FIG. 11c, a partial area of the first resist layer 111, which is an area other than at least one via hole 112, is exposed by using a mask with an opening corresponding to the partial area out of the via hole 112.

Figure 11D:
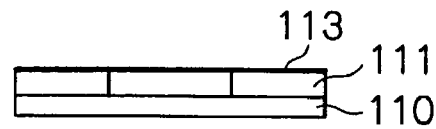

Then, as shown in FIG. 11d, a separator layer or a barrier layer 113 is formed on the first resist layer 111.

Figure 11E:
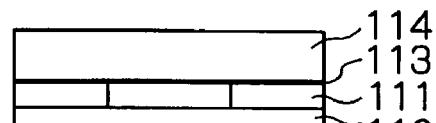

Then, as shown in FIG. 11e, a second resist material is coated on the separator layer 113, and then pre-baked to form the second resist layer 114.

A positive resist material or a negative resist material can be used for the second resist material. In this embodiment, the second resist material is the positive resist material. If the negative resist material is used as for the second resist material, the exposing pattern should be inversed. A thickness of the second resist layer 114 is 3–30 µm, but is not limited to this range.

Figure 11F:
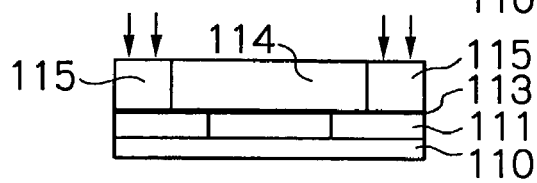

Then, as shown in FIG. 11f, a partial area to be removed 115 of the second resist layer 114 is exposed by using a mask with an opening corresponding to the area to be removed 115. In this embodiment, the partial area to be removed 115 is an area out of a circle with a larger diameter than that of the via hole 112. Therefore, a mask pattern finally formed will have a T-shaped cross section with a lower portion and an upper portion that is wider than the lower portion.

Figure 11G:
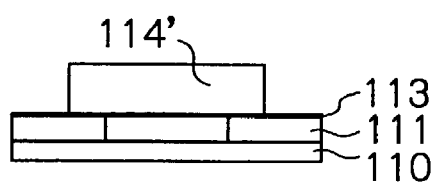

Then, a first development is performed to remove the partial area 115 of the second resist layer 114 and to form the patterned second resist layer 114' as shown in FIG. 11g.

Figure 11H:
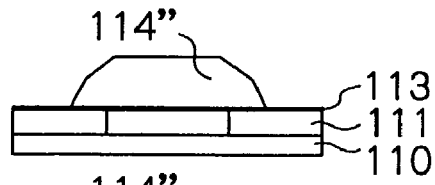

Thereafter, as shown in FIG. 11h, a heat treatment or a baking process is performed to reflow the second resist layer 114', and thus a deformed resist layer 114" with slant upper surface edges is provided.

In case that SIPR9350 of Shin-Etsu Chemical Co., Ltd. or AZP4620 of Clariant (Japan) K.K. is used as for the second resist material, the heat treatment may be achieved by keeping an temperature of the second resist layer at 130° C. for 30 minutes for example.

Figure 11I:

Then, as shown in FIG. 11i, an exposed part of the separator layer 113 is removed.

Figure 11J:
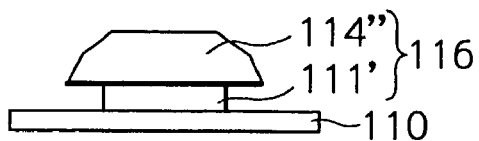

Then, a second development is performed to remove the partial area of the first resist layer 111, which is an area other than the via hole 112, and to form the patterned first resist layer 111'. Thus, a mask pattern 116 having a substantially T-shaped cross section of the lower patterned first resist layer 111' and the upper patterned second resist layer 114' that is wider than the lower resist layer 111' as shown in FIG. 11j is formed.

Figure 11K:
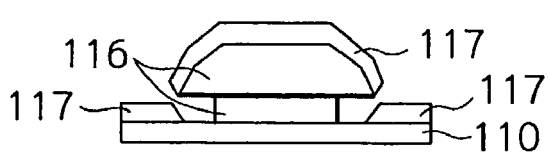

Thereafter, as shown in FIG. 11k, a film to be patterned 117 made of for example alumina is sputtered on the base layer 110 and the mask pattern 116.

Then, the mask pattern 116 is dissolved by using an organic solvent such as acetone or NMP (N-methyl-2-pyrrolidone) to lift off the unnecessary area of the film to be patterned 117. Thus, a patterned thin-film with a desired shape can be formed.

According to this tenth embodiment, since the end edges of the upper surface of the second resist layer 114' are slanted by the heat treatment, a via hole pattern with a very steep side wall can be provided. Also, the slant upper surface edges will prevent possible hanging down of the second resist layer 114" due to generated heat during the sputtering. Furthermore, according to this embodiment, since the separator layer 113 is used, the mask pattern can be thickened without producing intermixing, deformation nor delamination at the interface between the first resist layer 111 and the second resist layer 114. As a result, when the patterning of for example at least one via hole is performed by the lift-off method with using this mask pattern, a relatively thick film with a desired good shape can be fabricated.

In addition, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

FIGS. 12a to 12k illustrate a thin-film forming process for patterning at least one via hole by using a lift-off method as an eleventh embodiment according to the present invention. Although this embodiment concerns forming of at least one via hole with an embedded via hole conductor or an embedded straight bump for electrically connecting a lead conductor and a connection pad, the same process may be applied to a patterning method of a film of other thin-film element, a semiconductor element or a micro device.

Figure 12A:
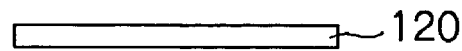
FIGS. 12a to 12k show sectional views illustrating a thin-film forming process for patterning at least one via hole by using a lift-off method as an eleventh embodiment according to the present invention.

First, as shown in FIG. 12a, a substrate or on a film (base layer) 120 on which at least one via hole is to be formed is provided.

Figure 12B:
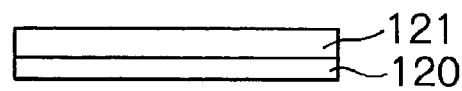

Then, as shown in FIG. 12b, a first resist material is coated on the base layer 120, and then pre-baked to form a first resist layer 121.

A positive resist material or a negative resist material can be used as the first resist material. In this embodiment, a positive resist material is used for the first resist material. If the negative resist material is used as for the first resist material, the exposing pattern should be inversed. A thickness of the first resist layer 121 is 3–30 μm, for example 3 μm, but is not limited to this range.

Figure 12C:
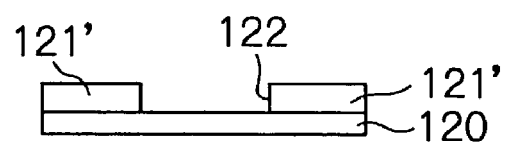

Then, a partial area of the first resist layer 121, which is an area of at least one via hole 122, is exposed by using a mask with an opening corresponding to the partial area of the via hole 122, and a first development is performed to remove this partial area of the first resist layer 121 to form a patterned first resist layer 121' as shown in FIG. 12c.

Figure 12D:
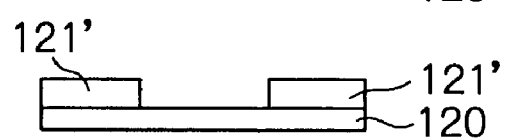
Figure 12E:
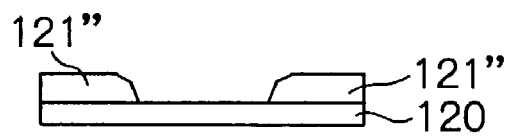

Then, as shown in FIG. 12d, this first resist layer 121' is exposed and a heat treatment or a baking process is performed to reflow the first resist layer 121'. Thus, as shown in FIG. 12e, a deformed resist layer 121" with slant upper surface edges is provided.

Figure 12F:

Then, as shown in FIG. 12f, a separator layer or a barrier layer 123 is formed on the first resist layer 121' and on the base layer 120 in the via hole 122.

Figure 12G:
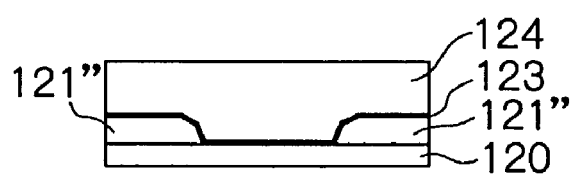

Then, as shown in FIG. 12g, a second resist material is coated on the separator layer 123, and then pre-baked to form the second resist layer 124.

A positive resist material or a negative resist material can be used for the second resist material. In this embodiment, the second resist material is the positive resist material. If the negative resist material is used as for the second resist material, the exposing pattern should be inversed. A thickness of the second resist layer 124 is 3–30 μm, but is not limited to this range.

Figure 12H:
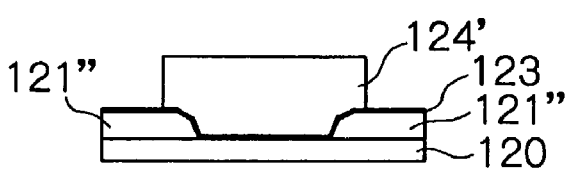

Then, a partial area to be removed 125 of the second resist layer 124 is exposed by using a mask with an opening corresponding to the area to be removed 125, and a second development is performed to remove the partial area 125 of the second resist layer 124. Thus, the patterned second resist layer 124' as shown in FIG. 12h is formed. In this embodiment, the partial area to be removed 125 is an area out of a circle with a larger diameter than that of the via hole 122. Therefore, a mask pattern finally formed will have a T-shaped cross section with a lower portion and an upper portion that is wider than the lower portion.

Figure 12I:
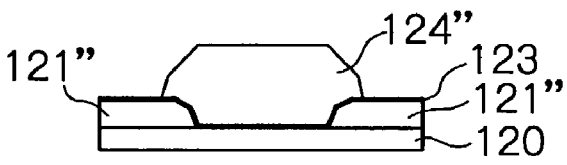

Then, as shown in FIG. 12i, a heat treatment or a baking process is performed to reflow the second resist layer 124', and thus a deformed resist layer 124" with slant upper surface edges is provided.

In case that SIPR9350 of Shin-Etsu Chemical Co., Ltd. or AZP4620 of Clariant (Japan) K.K. is used as for the second resist material, the heat treatment may be achieved by keeping an temperature of the second resist layer at 130° C. for 30 minutes for example.

Figure 12J:
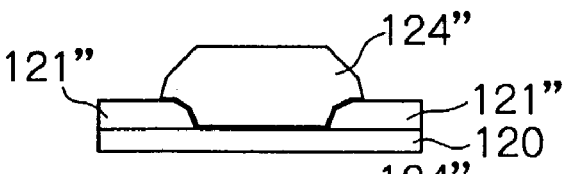

Then, as shown in FIG. 12j, an exposed part of the separator layer 123 is removed.

Figure 12K:
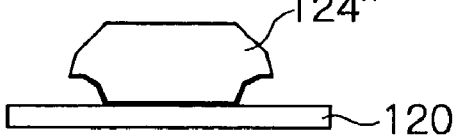

Then, a third development is performed to remove all the first resist layer 121' and to form a mask pattern mainly made of the second resist layer 124" having a substantially T-shaped cross section of a lower portion and an upper portion that is wider than the lower portion as shown in FIG. 12k is formed.

Thereafter, a lift-off process using this mask pattern is performed as well as in the first embodiment, and thus a patterned thin-film with a desired shape can be formed.

According to this eleventh embodiment, since the end edges of the upper surface of the second resist layer 124" are slanted by the heat treatment, a via hole pattern with a very steep side wall can be provided. Also, the slant upper surface edges will prevent possible hanging down of the second resist layer 124" due to generated heat during the sputtering. Particularly, in this embodiment, the mask pattern has a stable shape because the root of the mask pattern (lower portion) has a heavy gauge. Furthermore, according to this embodiment, since the separator layer 123 is used, the mask pattern can be thickened without producing intermixing, deformation nor delamination at the interface between the first resist layer 121 and the second resist layer 124. As a result, when the patterning of for example at least one via hole is performed by the lift-off method with using this mask pattern, a relatively thick film with a desired good shape can be fabricated.

In addition, according to the embodiment, as the mask pattern is formed by using the exposure process, an optional cross section shape can be precisely controlled.

It is desired that a thickness of the first resist layer is about 1.1 to 1.3 times of that of the layer to be lifted-off.

It is needless to say that the mask pattern forming method of this embodiment can be adopted to not only a forming method of a mask pattern used in a lift-off process but also a forming method of a mask pattern used in fabrication of a three-dimensional pattern.

Although described is a method of forming a thin-film pattern with a low aspect ratio on a flat surface substrate, this embodiment can be adopted to a method of forming a thin-film pattern on a rough surface substrate with large steps and to a method of forming a thin-film pattern with a high aspect ratio on a substrate.

In modifications of the aforementioned embodiments, a shape of the via hole may be an optional shape such as a circle, a rectangular or else, for example, a complex shape as a cross shape.

Hereinafter, the present invention will be described more concretely with reference to various examples.

EXAMPLE 1

This example 1 corresponds to the aforementioned first embodiment.
(A) A Si substrate is prepared.
(B) A positive novolak I-line resist such as SIPR-9281-6.0 of Shin-Etsu Chemical Co., Ltd. is spin-coated (at 2,100 rpm) on the substrate to be 7.7 μm thickness, and pre-baked at 110° C. for 180 seconds to form a first resist layer.
(C) The first resist layer is exposed under the following conditions,
  Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm),
  Mask: Rectangular photosensitive area of 15×20 μm.
(D) The first resist layer is developed, by the puddle method for 50 seconds×7 times, using an alkaline aqueous solution (developing solution) of 2.38%—TMAH aq. and then rinsed with water and dried.
(E) The first resist layer is entirely exposed under the following conditions,
  Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm),
  Mask: none (entire surface exposure).
(F) Carbon is deposited to form a separator layer of carbon (amorphous carbon) with a thickness of 0.002 μm,
  Vapor deposition equipment; Quick Coater SC-708C/DCS of Sanyu Electron Co., Ltd.
(G) A positive or negative novolak I-line resist such as positive SIPR-9281-6.0 of Shin-Etsu Chemical Co., Ltd. is spin-coated (at 2,100 rpm) on the substrate to be 7.7 μm thickness, and pre-baked at 110° C. for 180 seconds to form a second resist layer.
(H) The second resist layer is exposed under the following conditions in case of positive SIPR-9281-6.0 of Shin-Etsu Chemical Co., Ltd.,
  Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm),
  Mask: Square dark area 40×40 μm, Center is the same position as that of the first resist layer exposure (different position may be accepted).
(I) The second resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.
(J) A part of the separator layer of carbon is removed by ashing process,
  Ashing equipment: System104 of Matrix Integrated Systems,
  Ashing conditions: Substrate temperature; 50° C., RF power; 200 W, Pressure; 1.5 Torr, O$_2$ gas rate; 100 sccm, CF$_4$ gas rate; 10 scam, Time; 15 seconds.
(K) The first resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.

According to the above-mentioned processes, a single-layer mask pattern for the lift-off method is obtained. Although delamination occurred between the resist layers when fabricating a two-layered mask pattern, such problems can be prevented in this example 1 with the single-layer structure.

When this mask pattern is utilized for the lift-off method, it is desired that a thin-film to be lifted off is thinner than the first resist layer. For example, the thin-film to be patterned by the lift-off method may have a thickness of 6 μm.

In the above-mentioned example 1, because a total area of the mask pattern is smaller than that of the region other than the mask pattern, materials of and process conditions used for both the first and second resist layers were the same. Therefore, the thickness of the second resist layer was 7.7 μm at its overhang portion and about 15.5 μm at its pillar portion.

When the first resist layer of the mask pattern is formed to have a plurality of via holes with a small spacing, the thickness of the second resist layer is controlled in response to the thickness of its pillar portion (a portion at the via hole of the first resist layer). Therefore, it is desired that a viscosity of the second resist layer material is higher than that of the first resist layer material so as to coat the second resist layer thicker than the first resist layer.

In this example, the carbon deposition (amorphous carbon) is used for the separator layer. However, following material may be used as for the separator layer.
(1) Sputtered metal layer, such as for example, a sputtered Ti film of 0.5–20 nm thickness, a sputtered Ta film of 0.5–20 nm thickness,
(2) Sputtered insulation material or semiconductor material layer, such as for example, a sputtered alumina film of 0.5–20 nm thickness, a sputtered Si film of 0.5–20 nm thickness, a sputtered SiO$_2$ film of 0.5–20 nm thickness,
(3) Coated organic material film, such as for example, a coated polyvinyl (acet) alcohol resin (coating of 2 wt % aqueous and drying), a coated fluororesin.

It is not necessary that the separator layer is transparent. This is because the alignment for exposure of the second resist layer can be executed by directly aligning the pattern of the first resist layer.

If the first resist layer is developed before forming of the second resist layer as in the aforementioned example 1, an azo-bond layer of the hydrophobic one-component NQD novolak resist can be formed at the surface of the first resist layer by the developing solution. In this case, no separator layer is necessary to form.

The separator layer formed under the mask pattern may be removed by an appropriate way such as an ashing method, an ion-milling method or a wet-etching method after the lift-off process.

Figure 13:
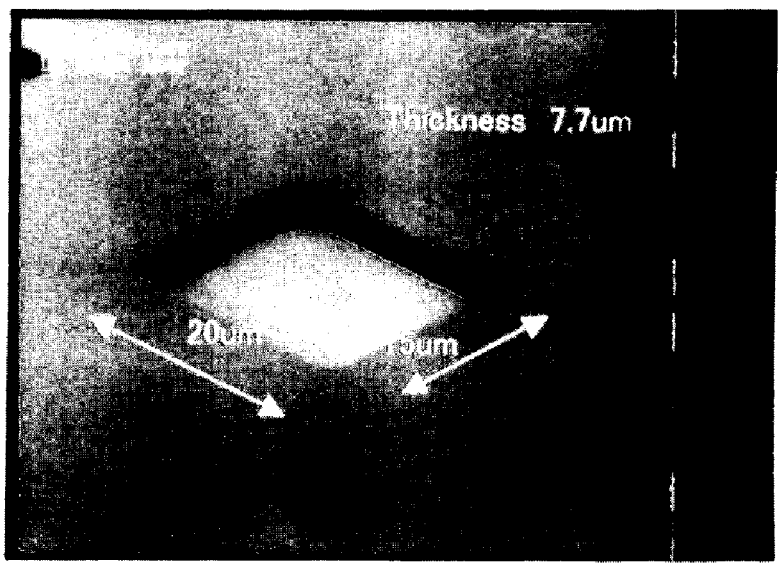
FIG. 13 shows a SEM photograph illustrating an example of a first resist layer developed at (D) in an example 1.
Figure 14:
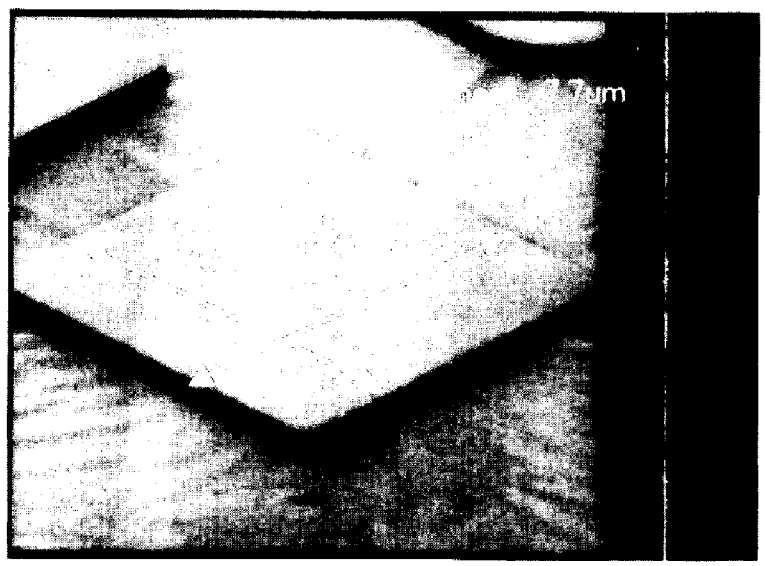
FIG. 14 shows a SEM photograph illustrating an example of a second resist layer developed at (I) in the example 1.
Figure 15:
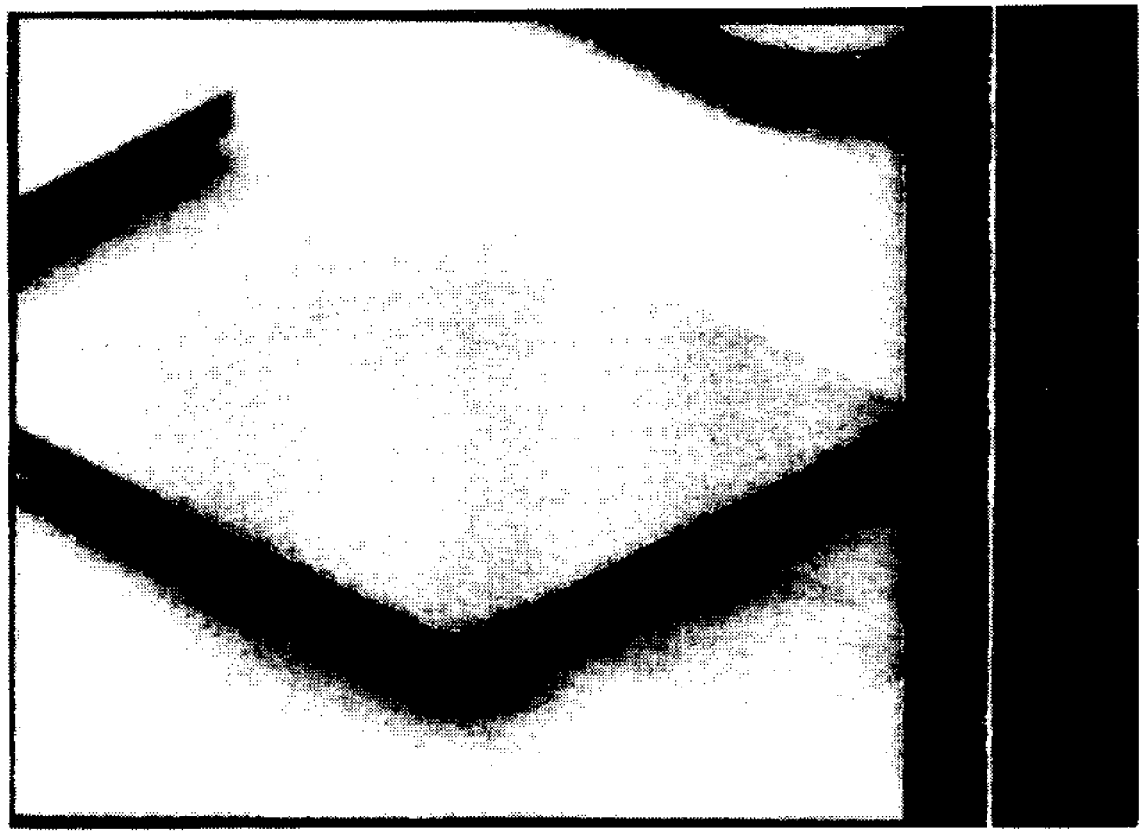
FIG. 15 shows a SEM photograph illustrating an example of the second resist layer developed at (K) in the example 1.

FIG. 13 is a scanning electron microscope (SEM) photograph illustrating an example of the first resist layer developed at the step (D) in the example 1, FIG. 14 is a SEM photograph illustrating an example of the second resist layer developed at the step (I) in the example 1, and FIG. 15 is a SEM photograph illustrating an example of the second resist layer developed at step (K) in the example 1.

EXAMPLE 2

This example 2 corresponds to the aforementioned second embodiment.
(A) Si substrate is prepared.
(B) A positive or negative novolak I-line resist such as positive SIPR-9281 of Shin-Etsu Chemical Co., Ltd. or negative TSMR-iN010LP i-line resist of Tokyo Ohka Kogyo Co., Ltd. is spin-coated on the substrate to be 4 μm thickness, and pre-baked at 100° C. for 180 seconds to form a first resist layer.
(C) The first resist layer is exposed under the following conditions in case of negative TSMR-iN010LP resist of Tokyo Ohka Kogyo Co., Ltd.,
Equipments: Stepper; NSR-TFHi12 of Nikon Corporation (NA=0.4, σ=0.4),
Dose: 1000 mJ/cm$^2$,
Focus: 2.0 μm,
Mask: Rectangular photosensitive area of 15×20 μm.
(D) The first resist layer is developed, by the puddle method for 60 seconds×2 times, using an alkaline aqueous solution (developing solution) of 2.38%—TMAH aq. such as SSFD238 of Shin-Etsu Chemical Co., Ltd. for example, and then rinsed with water and dried.
(E) A polyvinyl alcohol aqueous (3 wt %) or a fluororesin solution (3 wt %) is spin-coated to be 3 μm thickness (thinner than the first resist layer), and pre-baked at 150° C. for 180 seconds to form a non-reactive layer.
(F) A positive or negative novolak I-line resist such as positive SIPR-9281-6.0 of Shin-Etsu Chemical Co., Ltd. is spin-coated to be 4 μm thickness, and pre-baked at 100° C. for 180 seconds to form a second resist layer.
(G) The second resist layer is exposed under the following conditions in case of positive SIPR-9281-6.0 of Shin-Etsu Chemical Co., Ltd.,
Equipments: Stepper; NSR-TFHi12 of Nikon Corporation (NA=0.4, σ=0.4),
Dose: 1000 mJ/cm$^2$,
Focus: 2.0 μm,
Mask: Square dark area 40×40 μm, Center is the same position as that of the first resist layer exposure (different position may be accepted).
(H) The second resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.
(I) The non-reactive layer is removed. In case of the polyvinyl alcohol, since this non-reactive layer is removed during the developing process of the second resist layer, only a rinse with water is executed at this step.

EXAMPLE 3

This example 3 corresponds to the aforementioned fourth embodiment.
(A) Si substrate is prepared.
(B) A positive or negative novolak I-line resist such as positive SIPR-9281-2.0 of Shin-Etsu Chemical Co., Ltd. is spin-coated (3,000 rpm) on the substrate to be 2 μm thickness, and pre-baked at 110° C. for 180 seconds to form a resist layer.
(C) The resist layer is exposed under the following conditions in case of negative TSMR-iN010LP resist of Tokyo Ohka Kogyo Co., Ltd.,
Equipments: Stepper; NSR-TFHi12 of Nikon Corporation (NA=0.4, σ=0.4),
Dose: 300 mJ/cm$^2$,
Focus: 0.0 μm,
Mask: Square photosensitive area of 5×5 μm.
(D) The resist layer is developed, by the puddle method for 50 seconds×3 times, using an alkaline aqueous solution (developing solution) of 2.38%—TMAH aq., and then rinsed with water and dried.
(E) A metal layer of Ni—Fe alloy with 4 μm thickness is formed by electrolytic plating.
(F) The substrate is soaked and rocked in an acetone for 120 seconds to remove the resist layer, and then dried at 100° C. for 10 minutes.

According to the aforementioned processes, a mask pattern with an undercut width of 2 μm can be fabricated.

On the substrate beforehand, a Ti film of 5 nm thickness and a NiFe film of 50 nm thickness are sequentially deposited in this order as for an electrode film for plating. The electrode film for plating in a region other than the mask pattern may be removed after the resist removing step of (F) by for example an ion-milling method or a wet-etching method.

Conditions of the ion-milling may be as follows:
Milling equipment: 8C of Common Wells Co., Ltd.,
Milling conditions: Power; 500 W, 500 mA, Gas pressure; 3 mTorr, Milling angle; 60°.

In order to clearly remove the plating electrode film under the undercut, the milling angle is large.

The lift-off process is preferably performed by wet-etching using aqueous solution of ferric chloride for example.

The metal layer may be made of Cu instead of Ni—Fe alloy.

EXAMPLE 4

This example 4 corresponds to the aforementioned seventh embodiment.
(A) A Si substrate is prepared.
(B) A positive novolak I-line resist such as SIPR-9281-6.0 of Shin-Etsu Chemical Co., Ltd. is spin-coated (at 2,100 rpm) on the substrate to be 7.7 μm thickness, and pre-baked at 110° C. for 180 seconds to form a first resist layer.
(C) The first resist layer is exposed under the following conditions,
Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm),
Mask: Rectangular photosensitive area of 15×20 μm.
(D) As a second resist layer, a positive dry film resist of 3–30 μm thickness is pressed and transferred to laminate on the first resist layer. The positive dry film is formed for example by spin-coating or spray-coating a positive photosensitive coating resist such as SIPR-9281 of Shin-Etsu Chemical Co., Ltd. on a spread support film to be 10 μm thickness, and by baking it to dry.

(E) The second resist layer is exposed under the following conditions,

Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm), Mask: Square dark area 40×40 μm, Center is the same position as that of the first resist layer exposure (different position may be accepted).

(F) The second resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.

(G) The first resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.

EXAMPLE 5

This example 5 corresponds to the aforementioned eighth embodiment.

(A) Si substrate is prepared.

(B) As a first resist layer, a negative dry film resist such as a film resist 4706 of DuPont of 3–50 μm thickness is laminated on the substrate.

(C) The first resist layer is exposed under the following conditions,

Equipments: Proximity Mask Aligner; PLA-600FA of Canon Inc., Stepper; NSR-TFHi12 of Nikon Corporation (NA=0.4, σ=0.4, λ corresponds to 650 mJ/cm$^2$ of 365 nm), Mask: Rectangular photosensitive area of 15×20 μm.

(D) The first resist layer is developed using an alkaline aqueous solution of sodium hydrogencarbonate 2.38%—TMAH aq., and then rinsed with water and dried.

(E) A polyvinyl alcohol aqueous (3 wt %) or a fluororesin solution (3 wt %) is spin-coated to be 3 μm thickness (thinner than the first resist layer), and pre-baked at 150° C. for 180 seconds to form a non-reactive layer.

(F) A positive or negative novolak I-line resist such as positive SIPR-9281 of Shin-Etsu Chemical Co., Ltd. is spin-coated to be 4 μm thickness (thinner than the first resist layer), and pre-baked at 100° C. for 180 seconds to form a second resist layer.

(G) The second resist layer is exposed under the following conditions in case of positive SIPR-9281-6.0 of Shin-Etsu Chemical Co., Ltd., Equipments: Stepper; NSR-TFHi12 of Nikon Corporation (NA=0.4, π=0.4), Dose: 1000 mJ/cm$^2$, Focus: 2.0 μm, Mask: Square dark area 40×40 μm, Center is the same position as that of the first resist layer exposure (different position may be accepted).

(H) The second resist layer is developed, by the puddle method for 50 seconds×7 times, using an alkaline aqueous solution (developing solution) of 2.38%—TMAH aq. such as SSFD238 of Shin-Etsu Chemical Co., Ltd. for example, and then rinsed with water and dried.

(I) The non-reactive layer is removed. In case of the polyvinyl alcohol, since this non-reactive layer is removed during the developing process of the second resist layer, only a rinse with water is executed at this step.

Many widely different embodiments an examples of the present invention may be constructed without departing from the spirit and scope of the present invention. It should be understood that the present invention is not limited to the specific embodiments an examples described in the specification, except as defined in the appended claims.

What is claimed is:

1. A patterning method of a thin-film comprising the steps of:
    laminating a first resist layer on a base layer;
    exposing the first resist layer using a first pattern with a pattern of at least one via hole;
    developing the first resist layer exposed to remove a part of the first resist layer, said part corresponding to an area other than said at least one via hole;
    laminating a non-reactive layer on the base layer in said area other than said at least one via hole;
    laminating a second resist layer on the first resist layer and on the non-reactive layer;
    exposing the second resist layer using a second pattern;
    developing the second resist layer exposed to remove a part of the second resist layer;
    removing the non-reactive layer to form a mask pattern made of the first resist layer and the second resist layer;
    patterning the thin film using the formed mask pattern; and
    removing the mask pattern from the patterned thin-film.

2. The method as claimed in claim 1, wherein said method further comprises a step of heating the second resist layer to slant end edges of an upper surface of the second resist layer after the developing step of the second resist layer, and wherein the removing step of the non-reactive layer includes removing all of the non-reactive layer.

3. The method as claimed in claim 1, wherein the mask pattern has a lower portion and an upper portion wider than the lower portion.

4. A patterning method of a thin-film comprising the steps of:
    laminating a first resist layer on a base layer;
    exposing the first resist layer using a first pattern with a pattern of at least one via hole;
    developing the first resist layer exposed to remove a part of the first resist layer, said part corresponding to an area other than said at least one via hole;
    laminating a non-reactive layer on the base layer in said area other than said at least one via hole;
    removing a remaining part of the first resist layer, said remaining part corresponding to an area of said at least one via hole;
    laminating a second resist layer on the base layer in the area of said at least one via hole and on the non-reactive layer;
    exposing the second resist layer using a second pattern;
    developing the second resist layer exposed to remove a part of the second resist layer;
    removing the non-reactive layer to form a mask pattern made of the second resist layer;
    patterning the thin film using the formed mask pattern; and
    removing the mask pattern from the patterned thin-film.

5. The method as claimed in claim 4, wherein said method further comprises a step of heating the second resist layer to slant end edges of an upper surface of the second resist layer after the developing step of the second resist layer, and wherein the removing step of the non-reactive layer includes removing all of the non-reactive layer.

6. The method as claimed in claim 4, wherein the mask pattern has a lower portion and an upper portion wider than the lower portion.

7. A patterning method of a thin-film comprising the steps of:
laminating a resist layer on a base layer;
exposing the resist layer using a pattern of at least one via hole;
developing the resist layer exposed to remove a part of the resist layer, said part corresponding to an area of said at least one via hole;
plating a metal layer on the base layer in said area of said at least one via hole, said metal layer being thicker than that of said resist layer;
developing the resist layer to remove the resist layer so as to form a mask pattern made of the metal layer and provided with a lower portion and an upper portion wider than the lower portion;
patterning the thin film using the formed mask pattern; and
removing the mask pattern from the patterned thin-film.

8. A patterning method of a thin-film comprising the steps of:
laminating a resist layer on a base layer;
exposing the resist layer using a pattern of at least one slit;
developing the resist layer exposed to remove a part of the resist layer, said part corresponding to an area of said at least one slit;
plating a metal layer on the base layer in said area of said at least one slit, said metal layer being thicker than that of said resist layer;
developing the resist layer to remove the resist layer so as to form a mask pattern made of the metal layer and provided with a lower portion and an upper portion wider than the lower portion;
patterning the thin film using the formed mask pattern; and
removing the mask pattern from the patterned thin-film.

9. A patterning method of a thin-film comprising the steps of:
laminating a first resist layer on a base layer;
exposing the first resist layer using a first pattern with a pattern of at least one via hole;
laminating a second resist layer of a photosensitive film resist on the first resist layer exposed;
exposing the second resist layer using a second pattern;
developing the second resist layer exposed to remove a part of the second resist layer;
developing the first resist layer exposed to remove a part of the first resist layer so as to form a mask pattern made of the first resist layer and the second r esist layer;
patterning the thin film using the formed mask pattern; and
removing the mask pattern from the patterned thin-film.

10. The method as claimed in claim 9, wherein the mask pattern has a lower portion and an upper portion wider than the lower portion.

11. A patterning method of a thin-film comprising the steps of:
laminating a first resist layer of a photosensitive film resist on a base layer;
exposing the first resist layer using a first pattern with a pattern of at least one via hole;
developing the first resist layer exposed to remove a part of the first resist layer, said part corresponding to an area other than said at least one via hole;
laminating a non-reactive layer on the base layer in said area other than said at least one via hole;
laminating a second resist layer on the first resist layer and on the non-reactive layer;
exposing the second resist layer using a second pattern;
developing the second resist layer exposed to remove a part of the second resist layer;
removing the non-reactive layer to form a mask pattern made of the first resist layer and the second resist layer and provided with a lower portion and an upper portion wider than the lower portion;
patterning the thin film using the formed mask pattern; and
removing the mask pattern from the patterned thin-film.

12. The method as claimed in claim 11, wherein said method further comprises a step of heating the second resist layer to slant end edges of an upper surface of the second resist layer after the developing step of the second resist layer, and wherein the removing step of the non-reactive layer includes removing all of the non-reactive layer.

13. A patterning method of a thin-film comprising the steps of:
laminating a first resist layer of a photosensitive film resist on a base layer;
exposing the first resist layer using a first pattern with a pattern of at least one via hole;
developing the first resist layer exposed to remove a part of the first resist layer, said part corresponding to an area other than said at least one via hole;
laminating a non-reactive layer on the base layer in said area other than said at least one via hole;
laminating a second resist layer on the non-reactive layer;
exposing the second resist layer using a second pattern;
developing the second resist layer exposed to remove a part of the second resist layer;
removing the non-reactive layer to form a mask pattern made of the first resist layer and the second resist layer and provided with a lower portion and an upper portion wider than the lower portion;
patterning the thin film using the formed mask pattern; and
removing the mask pattern from the patterned thin-film.

14. The method as claimed in claim 13, wherein said method further comprises a step of heating the second resist layer to slant end edges of an upper surface of the second resist layer after the developing step of the second resist layer, and wherein the removing step of the non-reactive layer includes removing all of the non-reactive layer.

15. A patterning method of a thin-film comprising the steps of:
laminating a first resist layer on a base layer;
exposing the first resist layer using a first pattern with a pattern of at least one via hole;
laminating a separator layer and a second resist layer on the first resist layer exposed;
exposing the second resist layer using a second pattern;
developing the second resist layer exposed to remove a part of the second resist layer;
heating the second resist layer to slant end edges of an upper surface of the second resist layer;
removing a part of the separator layer;
developing the first resist layer to remove a part of the first resist layer so as to form a mask pattern made of the first resist layer, the separator layer and the second resist layer;
patterning the thin film using the formed mask pattern; and
removing the mask pattern from the patterned thin-film.

16. The method as claimed in claim 15, wherein the mask pattern has a lower portion and an upper portion wider than the lower portion.

* * * * *